(12) United States Patent
Takemasa

(10) Patent No.: US 7,615,835 B2
(45) Date of Patent: Nov. 10, 2009

(54) PACKAGE FOR SEMICONDUCTOR ACCELERATION SENSOR

(75) Inventor: Kengo Takemasa, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 49 days.

(21) Appl. No.: 11/427,784

(22) Filed: Jun. 29, 2006

(65) Prior Publication Data
US 2007/0024409 A1 Feb. 1, 2007

(30) Foreign Application Priority Data
Jul. 27, 2005 (JP) ............................. 2005-217817

(51) Int. Cl.
*H01L 23/055* (2006.01)
(52) U.S. Cl. .................... 257/417; 257/701; 257/E21.5; 257/E23.19
(58) Field of Classification Search .............. 257/E21.5, 257/E23.188, E23.194, 415, 417, 701, E23.19
See application file for complete search history.

(56) References Cited

U.S. PATENT DOCUMENTS 5,355,712 A * 10/1994 Petersen et al. ............... 73/1.38
6,082,197 A * 7/2000 Mizuno et al. ............. 73/514.36
6,566,742 B1 * 5/2003 Matsumoto et al. .......... 257/678
6,674,159 B1 * 1/2004 Peterson et al. ............. 257/680
6,768,196 B2 * 7/2004 Harney et al. ............... 257/729
7,005,732 B2 * 2/2006 Horning et al. ............. 257/678
2004/0232507 A1 * 11/2004 Furukubo et al. ........... 257/433
2005/0062067 A1 * 3/2005 Kunda et al. ............... 257/202
2006/0219006 A1 * 10/2006 Nasiri et al. .............. 73/504.12

FOREIGN PATENT DOCUMENTS

JP     6-160423 A    6/1994
JP     6-289048 A    10/1994

\* cited by examiner

*Primary Examiner*—Minh-Loan T Tran
*Assistant Examiner*—W. Wendy Kuo
(74) *Attorney, Agent, or Firm*—Rabin & Berdo, P.C.

(57) ABSTRACT

A semiconductor device comprises a package having a cavity in the interior thereof, a chip having a semiconductor element, a board having the chip fixed to a first region on the upper face thereof, and an adhesive portion formed in a second region on the bottom face of the board in order to fix the board to a first face of the cavity, the second region being a region on the board other than the region thereof underneath the first region.

10 Claims, 17 Drawing Sheets

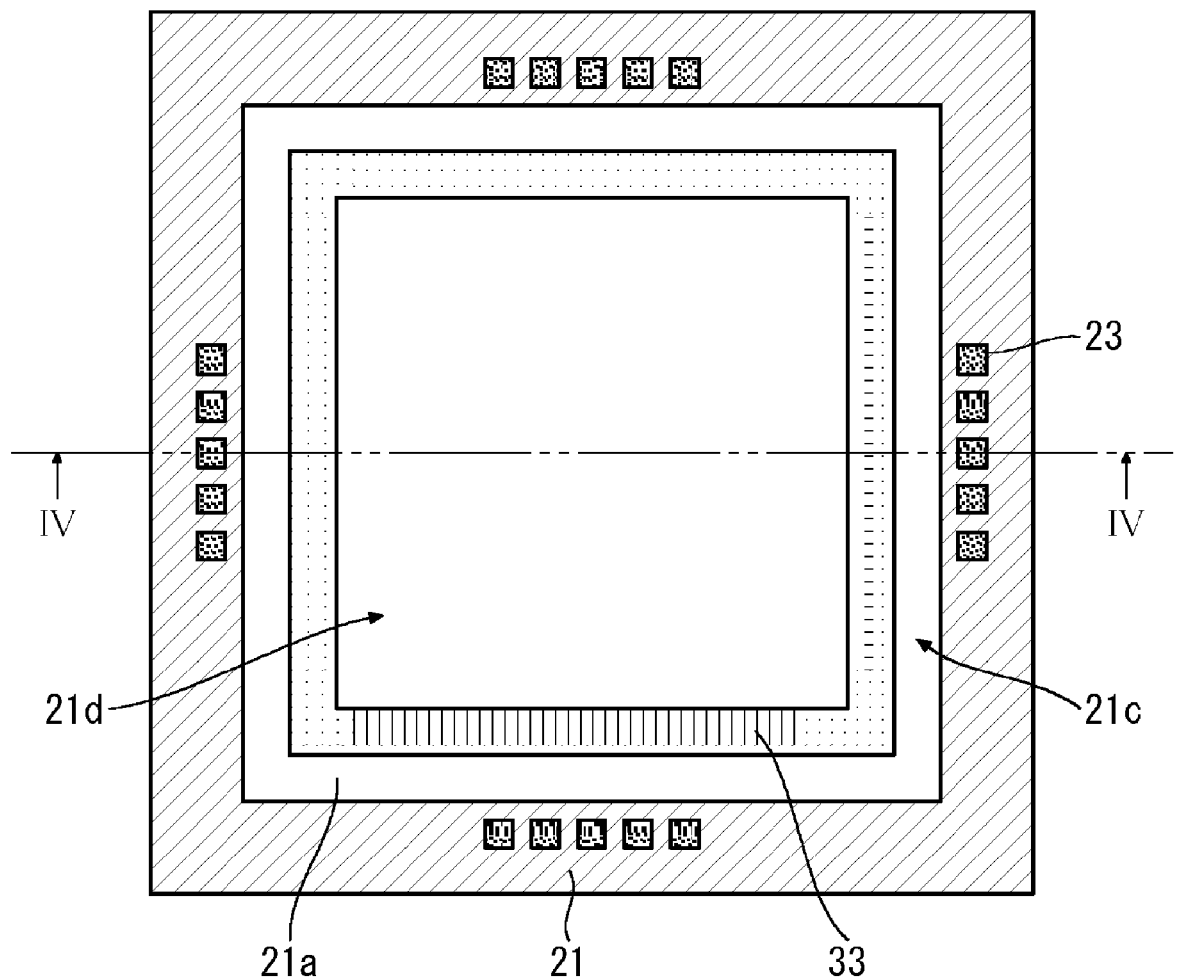

PACKAGE FOR SEMICONDUCTOR ACCELERATION SENSOR

BACKGROUND OF THE INVENTION

1. Field of the Invention

The present invention relates to a semiconductor device contained inside a package thereof. Particularly, the present invention relates to a semiconductor device in which an acceleration sensor for detecting acceleration in three dimensions is contained inside the package.

2. Background Information

In recent years, acceleration sensors have come to be widely used in various fields of industry such as automobiles, robots, various precision equipments, etc. Particularly, the demand for semiconductor acceleration sensors using a MEMS (micro electro mechanical system) has dramatically increased, for it is small in size, light, inexpensive, and can be expected to operate accurately and reliably.

There is a type of semiconductor acceleration sensor which detects acceleration by using the piezoresistive effect, i.e., a phenomenon in which a resistance value changes in proportion to a generated stress. This type of semiconductor acceleration sensor usually has a structure in which a semiconductor chip that forms a portion of a sensor portion (hereinafter such semiconductor chip will be referred to as a sensor chip) is contained inside a package that is comprised of a ceramic material.

A sensor chip using the piezoresistive effect, for instance, has a structure in which a weight portion placed in the center thereof is supported by four flexible beams, each of which has one end fixed to a square fixing portion. These beams each have piezoresistive elements attached thereto, and a Wheatstone bridge circuit can be obtained by connecting these piezoresistive elements to each other via wiring patterns.

In a semiconductor acceleration sensor having such sensor chip, the beams will bend due to the stress generated by the inertial movement of the weight portion when there is a change in speed. At the same time, the piezoresistive elements attached to the beams will also bend. Due to such bending, the resistance value of each piezoresistive element will change, resulting in a change in the resistance balance in the Wheatstone bridge. Acceleration can be detected by measuring such change in resistance balance as a current change or a voltage change.

A package for housing the sensor chip is usually fixed to a predetermined circuit using an adhesive material such as a resin. Therefore, when the circuit substrate is deformed due to heat expansion, for instance, the sensor chip and the package will be deformed together.

Examples of methods used to deal with this type of problem are introduced in Laid-Open Japanese Patent Application No. 6-160423 (hereinafter to be referred to as patent reference 1) and Laid-Open Japanese Patent Application No. 6-289048 (hereinafter to be referred to as patent reference 2).

In patent reference 1, a plate-like spacer is arranged between a package including the sensor portion of a capacitance acceleration sensor and a circuit substrate, for the purpose of absorbing possible deformation generated at the circuit substrate and thereby preventing the package from becoming deformed.

In patent reference 2, only a portion of the lower surface of a package including the sensor portion of a capacitance acceleration sensor is fixed to a circuit substrate, and due to this arrangement, the amount of deformation transferred from the circuit substrate to the package will be reduced.

In these prior art methods, however, when heat is transmitted to the package from outside or from the circuit substrate, for instance, stress will be applied to the semiconductor chip serving as the sensor portion due to deformation generated in the package by means of the heat, or due to expansion in both the resin bonding the package and the sensor portion caused by the heat. This will lead to deformation of the semiconductor chip.

Particularly, with respect to a semiconductor acceleration sensor, in order to secure sufficient impact resistance, a silicone resin having a comparatively low elastic modulus is used in adhering the semiconductor chip serving as the sensor portion to the package. However, a resin having a comparatively low elastic modulus usually has a large heat expansion coefficient. Therefore, the semiconductor chip may be deformed to a considerable extent, depending on the heat transmitted to the resin.

When deformation is generated in the semiconductor chip serving as the sensor portion, the piezoresistive elements attached to the semiconductor chip will also be deformed. As a result, the electrical characteristics of the piezoresistive elements may change, which lead to the sensor chip not being able to detect acceleration accurately.

Therefore, the conventional semiconductor acceleration sensor has had difficulties in operating stably with respect to heat transmitted to the package thereof.

In view of the above, it will be apparent to those skilled in the art from this disclosure that there exists a need for an improved semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor device capable of operating stably against heat and stress transmitted to a package thereof.

In accordance with a first aspect of the present invention, a semiconductor device comprises a package having a cavity in the interior thereof, a chip comprising a semiconductor element, a board comprising the chip fixed to a first region on the upper face thereof, and an adhesive portion formed in a second region on the bottom face of the board for fixing the board to a first face of the cavity, the second region being a region on the bottom face of the board other than the region underneath the first region.

In accordance with a second aspect of the present invention, in the semiconductor device according to the first aspect, the package comprises a concave portion formed in the first face under the chip.

In accordance with a third aspect of the present invention, in the semiconductor device according to the second aspect, the package comprises a convex portion at the bottom face of the concave portion.

In accordance with a fourth aspect of the present invention, in the semiconductor device according to the first, second or third aspect, the first region is separated from the second region in a horizontal direction.

In accordance with a fifth aspect of the present invention, in the semiconductor device according to the first, second, third or fourth aspect, the adhesive portion is formed along the exterior edge of the bottom face of the board.

In accordance with a sixth aspect of the present invention, in the semiconductor device according to the third aspect, the upper face of the convex portion is approximately the same height as the first face.

In accordance with a seventh aspect of the present invention, in the semiconductor device according to the first, second, third, fourth, fifth or sixth aspect, the adhesive portion is solidified resin.

In accordance with a eighth aspect of the present invention, in the semiconductor device according to the first, second, third, fourth, fifth or sixth aspect, the adhesive portion is comprised of silicone resin or fluorine resin.

In accordance with a ninth aspect of the present invention, in the semiconductor device according to the first, second, third, fourth, fifth, sixth, seventh or eighth aspect, the board is comprised of a silicon material.

In accordance with a tenth aspect of the present invention, the semiconductor device according to the first, second, third, fourth, fifth, sixth, seventh, eighth or ninth aspect further comprises a first electrode pad formed on the chip, a wiring pattern formed in the package, at least a portion of the wiring pattern being exposed inside the cavity, a second electrode pad formed on the bottom face of the package and connecting with the wiring pattern, and a metal wire electrically connecting the first electrode pad and the exposed wiring pattern.

In accordance with a eleventh aspect of the present invention, in the semiconductor device according to the first, second, third, fourth, fifth, sixth, seventh, eighth, ninth or tenth aspect, at least a portion of the package is comprised of a ceramic material.

In accordance with a twelfth aspect of the present invention, in the semiconductor device according to the first, second, third, fourth, sixth, seventh, eighth, ninth, tenth or eleventh aspect, the semiconductor element comprises an acceleration sensor.

In accordance with a thirteenth aspect of the present invention, in the semiconductor device according to the first, second, third, fourth, fifth, sixth, seventh, eighth, ninth, tenth or eleventh aspect, the semiconductor element includes an acceleration sensor having a fixing portion, a spindle body and one or more beams, the fixing portion being fixed to the board, the beams suspending the spindle body from the fixing portion, and the spindle body being capable of moving with respect to the fixing portion.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 5 is a sectional view of the semiconductor acceleration sensor device according to the first embodiment of the present invention taken along line III-III' shown in FIG. 2;

DETAILED DESCRIPTION OF THE PREFERRED EMBODIMENTS

Figure 1:
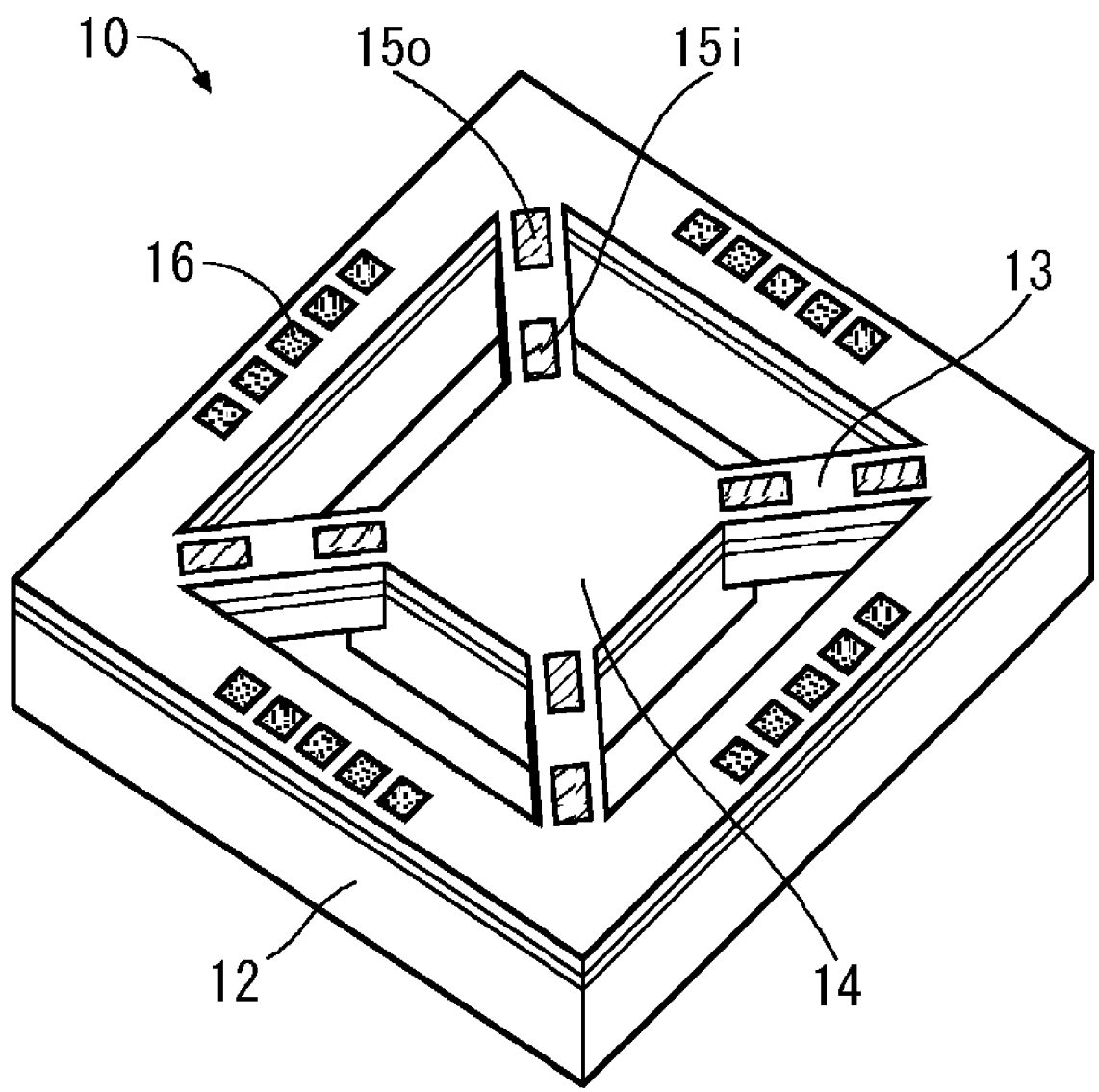
FIG. 1 is a perspective view showing an outline structure of a semiconductor acceleration sensor chip according to the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. The structure shown in each drawing is depicted with a certain shape, size and position so as to show the outline of the present invention. Therefore, the present invention is not limited to the specific shape, size, and position depicted in the drawings. In addition, in each drawing, in order to clearly show the structure, a portion of the hatching in a cross-sectional surface is omitted. Moreover, numerical values indicated in the following description are only given as examples, and therefore, they are not for the purpose of limiting the present invention. These conditions apply equally to all the embodiments of the present invention.

Structure of Semiconductor Acceleration Sensor Chip 10

Now, a structure of a semiconductor acceleration sensor chip 10 according to the first embodiment of the present invention will be described in detail with reference to the drawings. This embodiment will show the application of a three dimensional acceleration sensor using the piezoresistive effect, i.e., a phenomenon in which a resistance value changes in proportion to a generated stress.

FIG. 1 is a perspective view showing an outline structure of the semiconductor acceleration sensor chip 10, which is the three dimensional acceleration sensor applied in this embodiment. As shown in FIG. 1, the semiconductor acceleration sensor chip 10 has a fixing portion 12, beams 13, a weight portion 14, piezoresistive elements 15i and 15o, and electrode pads 16. The fixing portion 12, the beams 13, and the weight portion 14 are integrated into a single body by processing a predetermined semiconductor substrate.

The predetermined semiconductor substrate into which the fixing portion 12, the beams 13, and the weight portion 14 are formed may be a silicon substrate, for instance.

The fixing portion 12 is arranged in a square shape by combining four column-shaped members, for instance, and has a square opening in the center thereof. The fixing portion 12 in the present invention, however, is not limited to this shape, and it is also possible to have a circular shape, for instance. In the following, for the convenience of explanation, the surface of the square shaped member on which the electrode pads 16 are formed and the surface of the beams 13 on which the piezoresistive elements 15i and 15o are formed will be collectively referred to as the upper side of the semiconductor acceleration sensor chip 10.

The length of each side of the outer circumference the fixing portion 12 is about 1.6 mm (millimeters), for instance. On the other hand, the length of each side of the inner circumference of the fixing portion 12 (i.e., the square opening) is about 1.2 mm, for instance. In this case, each column-shaped member that forms the fixing portion 12 will be about 0.2 mm in width on the upper face thereof. Here, the fixing portion 12 may be about 0.3 mm thick, for instance.

The beams 13 are disposed at each corner of the inner circumference of the fixing portion 12 and extend toward the center thereof. Therefore, in the semiconductor acceleration sensor chip 10 of this embodiment, there are four beams 13. However, the present invention is not limited to this structure, and it is also possible to have a structure in which each beam 13 is disposed at the approximate midpoint of each column-shaped member forming the fixing portion 12 and extends toward the center of the fixing portion 12.

The beams 13 are formed so that they will bend due to stress generated by the inertial movement of the weight portion 14 when the semiconductor acceleration sensor chip 10 is accelerated. That is, the beams 13 are configured to be flexible. In this embodiment, each beam 13 is made to be about 0.1 mm wide on the upper face and about 0.1 mm thick, for instance, in order to be flexible. Furthermore, each beam is formed such that the upper face thereof is level with the upper face of the fixing portion 12, and the lower face thereof will be at a higher position than the lower face of the fixing portion 12. Thus, for instance, if the lower face of the fixing portion 12 is to be fixed to a board or spacer 32, which will be described in more detail below, deformation of the beams 13 will not be inhibited by the spacer 32.

The weight portion 14 is disposed at the approximate center of the opening of the square fixing portion 12, and at the ends of the four beams 13. That is, the weight portion 14 is supported by the beams 13 such that the weight portion 14 will be positioned at the approximate center of the opening of the fixing portion 12.

The weight portion 14 functions as a weight for making the beams 13 bend in accordance with the acceleration applied to the semiconductor acceleration sensor chip 10. In this embodiment, the upper face of the weight portion 14 is a square that is about 0.6 mm on a side, for instance, and the thickness of the weight portion 14 is about 0.2 mm, for instance. In addition, the weight portion 14 is formed such that the upper face thereof will be at the same level as the upper faces of the fixing portion 12 and the beams 13, and the lower face thereof will be at a higher position than the lower face of the fixing portion 12. Thus, for instance, if the lower face of the fixing portion 12 is to be fixed to a spacer 32, which will be described in more detail below, displacement of the weight portion 14 with respect to the fixing portion 12 will not be inhibited by the spacer 32.

On the upper face of each beam 13, the piezoresistive element 15o is attached to the base of the beam with respect to the fixing portion 12, and the piezoresistive element 15i is attached to the base of the beam with respect to the weight portion 14. These piezoresistive elements 15o and 15i are electrically connected with the electrode pads 16 formed on the upper face of the fixing portion 12 through wiring patterns (not shown in the figure), thus forming a Wheatstone bridge circuit. Accordingly, by detecting the resistance balance of the piezoresistive elements 15i and 15o through the electrode pads 16 and the wiring patterns (not shown in the figure), it is possible to detect the amount of bending with respect to the beam 13, and based on the amount of bending with respect to the beam 13, it is possible to specify the magnitude and direction of acceleration applied to the semiconductor acceleration sensor chip 10.

Structure of Semiconductor Acceleration Sensor Device 1

Now, the structure of a semiconductor acceleration sensor device 1 according to the first embodiment of the present invention will be described in detail with reference to the drawings. The semiconductor acceleration sensor device 1 is formed by packaging the above-described semiconductor acceleration sensor chip 10.

Figure 2:
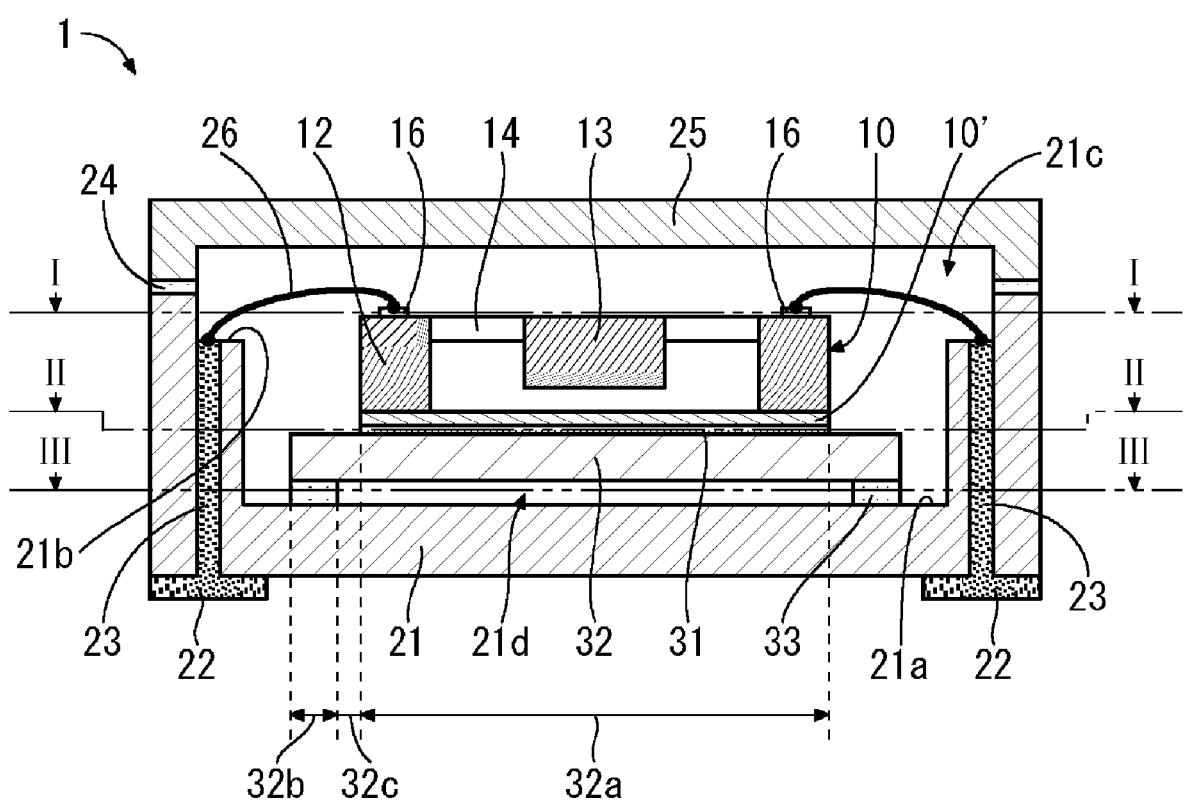
FIG. 2 is a sectional view of a semiconductor acceleration sensor device according to a first embodiment of the present invention.
Figure 3:
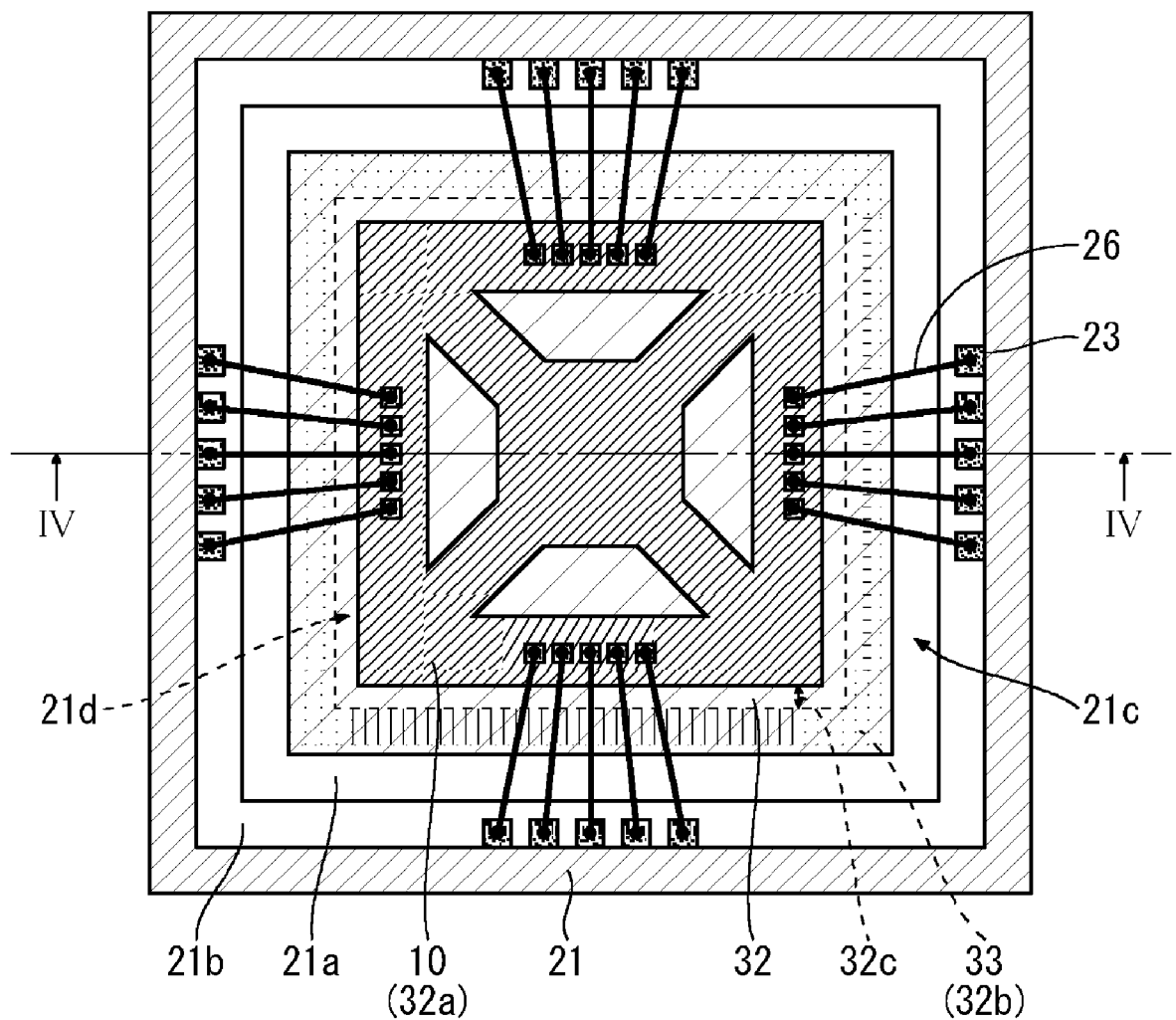
FIG. 3 is a sectional view of the semiconductor acceleration sensor device according to the first embodiment of the present invention taken along line I-I' shown in FIG. 2.
Figure 4:
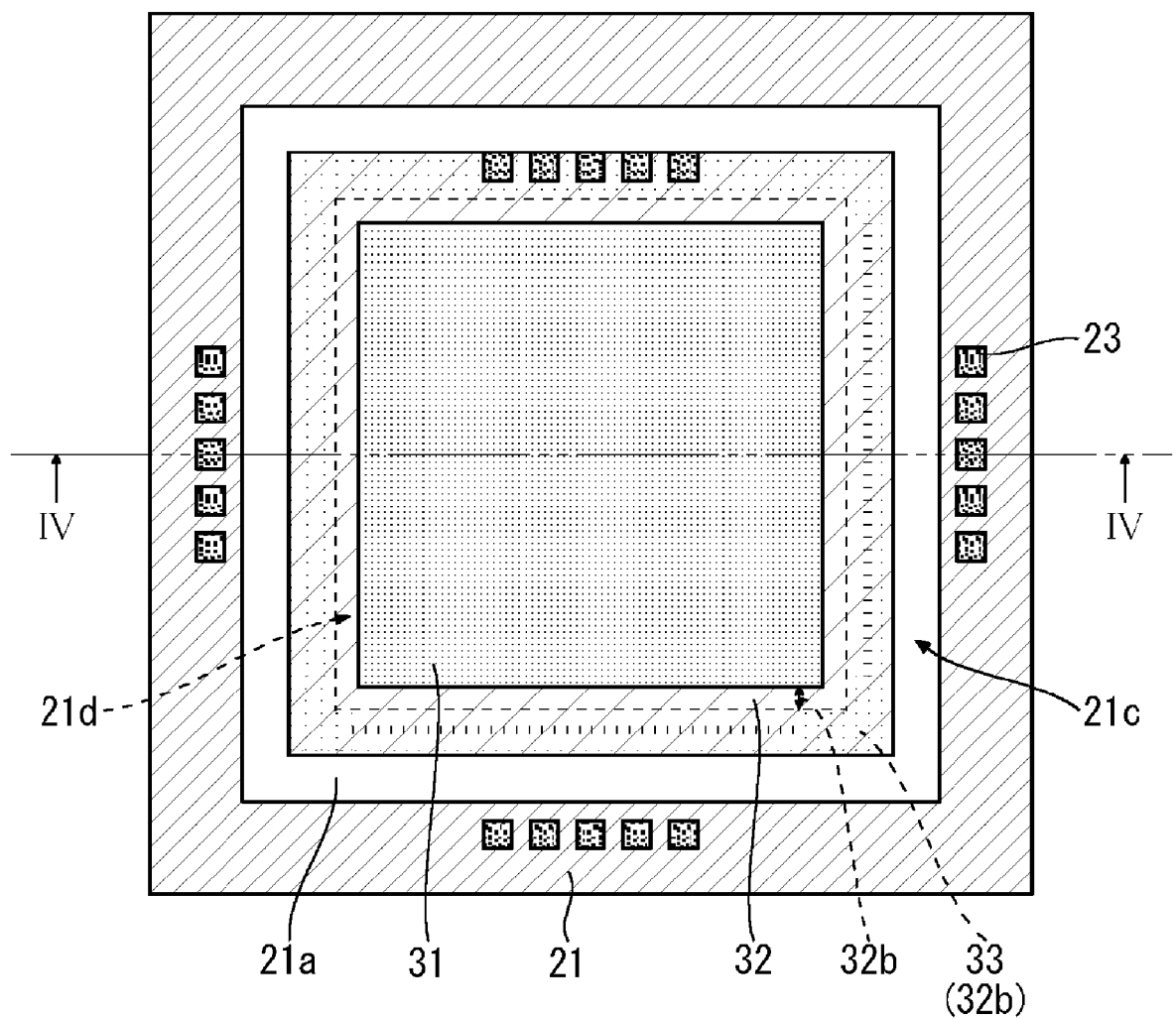
FIG. 4 is a sectional view of the semiconductor acceleration sensor device according to the first embodiment of the present invention taken along line II-II' shown in FIG. 2.

FIG. 2 is a sectional view of the semiconductor acceleration sensor device 1. FIG. 3 is a sectional view of the semiconductor acceleration sensor device 1 taken along line I-I' shown in FIG. 2, FIG. 4 is a sectional view of the semiconductor acceleration sensor device 1 taken along line II-II' shown in FIG. 2, and FIG. 5 is a sectional view of the semiconductor acceleration sensor device 1 taken along line III-III' shown in FIG. 2. Here, the section shown in FIG. 2 corresponds to a section of the semiconductor acceleration sensor device 1 taken along line IV-IV' shown in FIG. 3, FIG. 4 or FIG. 5.

As shown in FIG. 2 to FIG. 5, the semiconductor acceleration sensor device 1 includes the semiconductor acceleration sensor chip 10, a spacer 32, a lower container 21, and an upper lid 25. Here, the lower container 21 and the upper lid 25 form a package for housing the semiconductor acceleration sensor chip 10. In the following, for the convenience of explanation, the side where the upper lid 25 is positioned will be referred to as the upper side.

In this structure, the semiconductor acceleration sensor chip 10 is fixed to a predetermined region (i.e., a chip mount region 32a) on the upper face of the spacer 32, which is a plate-like member, through an adhesive material 31, and in this state, the semiconductor acceleration sensor chip 10 is contained inside a cavity of the package comprised of the lower container 21 and the upper lid 25. The spacer 32 is a deformation relief member which serves to prevent deformation generated in the lower container 21 from being directly transmitted to the semiconductor acceleration sensor chip 10, and may be a plate-like material made of silicon, for instance. Alternatively, for instance, it is possible to have a glass substrate 10', etc., bonded to the back side of the semiconductor acceleration sensor chip 10, and in this state, have the semiconductor acceleration sensor chip 10 fixed to the upper face of the spacer 32 through the adhesive material 31. In the present invention, the glass substrate 10' may be included in the semiconductor acceleration sensor chip 10. In the following, for the convenience of explanation, the semiconductor acceleration sensor chip is defined as including the glass substrate 10'. Accordingly, the back side of the semiconductor acceleration sensor chip 10 substantially indicates the back side of the glass substrate 10'.

The adhesive material 31 for use in adhering the semiconductor acceleration sensor chip 10 to the upper face of the spacer 32 may be a conductive or insulating adhesive material. For instance, conductive adhesive material includes solder paste or silver (Ag) paste, etc., and insulating adhesive material includes resin paste, etc. Here, it is preferable that the adhesive material 31 is applied only to the lower face of the semiconductor acceleration sensor chip 10.

As shown in FIG. 2 and FIG. 3, the semiconductor acceleration sensor chip 10 is fixed to a predetermined region (q.v. a chip mount region 32a in FIG. 2) on the upper face of the spacer 32 such that the lower face thereof will not stick out from the upper face of the spacer 32. Therefore, the semiconductor acceleration sensor chip 10 is designed such that sizes of the upper and lower faces of the spacer 32 will be slightly larger than the circumference of the lower face of the semiconductor acceleration sensor chip 10. To be more precise, the sizes of the upper and lower faces of the spacer 32 are designed to be larger than the size of the chip mount region 32a by more than a predetermined area in which the adhesive portion 33 is supposed to be formed (q.v. a margin 32b in FIG. 2). Here, the adhesive portion 33 serves to fix the spacer 32 to a bottom face 21a of a cavity 21c.

The lower container 21 that is a portion of the package for housing the semiconductor acceleration sensor chip 10 is a ceramic package having a laminated structure, for instance. As shown in FIG. 2, the lower container 21 includes a cavity 21c for housing the semiconductor acceleration sensor chip 10.

As shown in FIG. 2 and FIG. 3, sidewalls of the lower container 21 have step surfaces 21b which are positioned so as to be lower than the upper face of the cavity 21c (i.e., the surface of the cavity 21c on which the upper lid 25 is attached). Portions of a wiring pattern 23 that is formed inside the lower container 21 are exposed on each step surface 21b. The exposed portions of the wiring pattern 23 are electrically connected to the electrode pads 16 in the semiconductor acceleration sensor chip 10 through metal wires 26.

As shown in FIG. 2, the wiring patterns 23 formed inside the lower container 21 are electrically connected with metal pads (hereinafter referred to as foot patterns 22) which are formed at the lower face of the lower container 21. These foot patterns 22 function as electrode patterns that electrically connect to electrode pads in a circuit substrate (not shown in the figure).

As shown in FIG. 2 to FIG. 5, the spacer 32 having the semiconductor acceleration sensor chip 10 mounted thereon is fixed to the lower face 21a of the cavity 21c in the lower container 21, through an adhesive portion 33 made of a predetermined adhesive material.

As shown in FIG. 2 to FIG. 4, a margin 32b where the adhesive portion 33 for fixing the spacer 32 to the bottom face of the cavity 21c is to be formed is arranged along the outer edge of the spacer 32 in a square shape. The width of the margin 32b is set to a predetermined value such that a predetermined area sufficient to fix the spacer 32 having the semiconductor acceleration sensor chip 10 mounted thereon to the bottom face of the lower container 21 can be secured. In this embodiment, this width is set to about 0.5 mm, for instance. In addition, the circumference of the lower face of the semiconductor acceleration sensor chip 10 (which is equivalent to the circumference of the lower face of the fixing portion 12) is set to about 1.6 mm (millimeters) on a side. Accordingly, the circumference of the upper/lower face of the spacer 32 will be set to more than 2.6 mm.

Here, it is preferable that an outer circumference of the chip mount region 32a and an inner circumference of the margin 32b are apart by a predetermined distance in the horizontal direction, as shown in FIG. 2 to FIG. 4. This region between the chip mount region 32a and the margin 32b (q.v. a dividing region 32c in FIG. 2) functions as a region that prevents deformation generated in the bottom plate of the lower container 21 and in the outer edge of the spacer 32 (i.e., the margin 32b) due to the adhesive portion 33 expanding/shrinking in response to temperature changes, etc. from being transmitted directly to the semiconductor acceleration sensor chip 10. That is, this dividing region 32c functions as a region for absorbing possible deformation. In this embodiment, the width of the dividing region 32c is set to 0.2 mm, for instance. In addition, the circumference of the lower face of the semiconductor acceleration sensor chip 10 (which is equivalent to the circumference of the chip mount region 32a) is set to about 1.6 mm (millimeters) on a side, and the width of the margin 32b is set to about 0.5 mm. Accordingly, the circumference of the upper/lower face of the spacer 32 will be set to about 3.0 mm.

The margin 32b will have adhesive material applied thereon in order to form the adhesive portion 33. By fixing the adhesive portion 33 onto a predetermined position of the bottom face 21a of the cavity 21c in the lower container 21, the semiconductor acceleration sensor chip 10 will be housed inside the cavity 21c of the lower container 21, as shown in FIG. 2 to FIG. 5.

As for the adhesive material for forming the adhesive portion 33, which adheres the spacer 32 to the bottom face 21a of the cavity 21c, it is preferable that a resin having a comparatively low elastic modulus is used. By using such adhesive material, it will be possible to reduce impact transmitted to the semiconductor acceleration sensor 10, and thereby improve the impact resistance ability of the semiconductor acceleration sensor device 1. Moreover, as for the adhesive material for forming the adhesive portion 33, it is preferable that a resin having self-adhesive properties is used. Such resin may be a resin having poly-organosiloxane with a siloxane bond (Si—O) skeleton, such as a silicone resin, etc. In addition, it is also possible to use fluorine resin, etc., for instance.

As described above, in this embodiment, since the adhesive material is applied only at the margin 32b under the spacer 32 for forming the adhesive portion 33 and fixed to the bottom face 21a of the lower container 21, a hollow space 21d will be formed in between the portion of the spacer 32 where the adhesive portion 33 is not formed (i.e. the portion of the spacer 32 excluding the margin 32b) and the bottom face 21a, as shown in FIG. 2 and FIG. 5. Here, as described above, the margin 32b is arranged on the portion of the spacer 32 not included in the chip mount region 32a. Therefore, the hollow space 21d between the spacer 32 and the bottom face 21a lies along the entire space underneath the region where the semiconductor acceleration sensor chip 10 is fixed (i.e., underneath the chip mount area 32a). In other words, the adhesive portion 33 does not exist in the region underneath the semiconductor acceleration sensor chip 10. Accordingly, in the region underneath the semiconductor acceleration sensor chip 10, the spacer 32 is not touching the lower container 21.

In this way, by adhering the spacer 32 to the lower container 21 at the region besides under the semiconductor acceleration sensor chip 10, it will be possible to prevent the semiconductor acceleration sensor chip 10 from being directly influenced by possible deformation generated at the spacer 32 due to heat expansion of the adhesive portion 33. As a result, it will be possible to reduce deformation that might be generated in the semiconductor acceleration sensor chip 10 fixed to the chip mount region 32a, and thus, it will be possible to realize a semiconductor acceleration sensor device 1 which is capable of operating stably with respect to temperature changes.

Likewise, by adhering the spacer 32 to the lower container 21 on the region thereof other than under the semiconductor acceleration sensor chip 10, it will be possible to prevent the semiconductor acceleration sensor chip 10 from being directly influenced by a deformed part of the spacer 32, even when deformation generated at the bottom plate of the lower container 21 due to external force or temperature change is transmitted to the spacer 32. As a result, it will be possible to reduce deformation that might be generated in the semiconductor acceleration sensor chip 10 fixed to the chip mount region 32a, and thus, it will be possible to realize a semiconductor acceleration sensor device 1 which is capable of operating stably with respect to external forces or temperature changes.

As shown in FIG. 2 and FIG. 3, the electrode pads 16 in the semiconductor acceleration sensor chip 10 contained inside the cavity 21c of the lower container 21 are electrically connected to the exposed parts of the wiring patterns 23 on the step surfaces 21b of the lower container 21 through the metal wires 26. These metal wires 26 can be formed with metal such as gold, aluminum, etc., for instance.

The opening of the lower container 21 where the semiconductor acceleration sensor chip 10 is contained is sealed by the upper lid 25, as shown in FIG. 2. The upper lid 25 is fixed to the upper face of the lower container 21 by means of a thermosetting resin 24 such as epoxy resin, so as to seal the opening of the lower container 21. The material for forming the upper lid 25 may be a 42 metal alloy, stainless steel, etc., for instance. In addition, the inside of the sealed package (21, 25) is purged by nitrogen gas or dry air, etc., for instance.

Method of Manufacturing Semiconductor Acceleration Sensor Device 1

Now, a method of manufacturing the semiconductor acceleration sensor device 1 according to the first embodiment of the present invention will be described in detail with reference to the drawings.

Figure 6A:
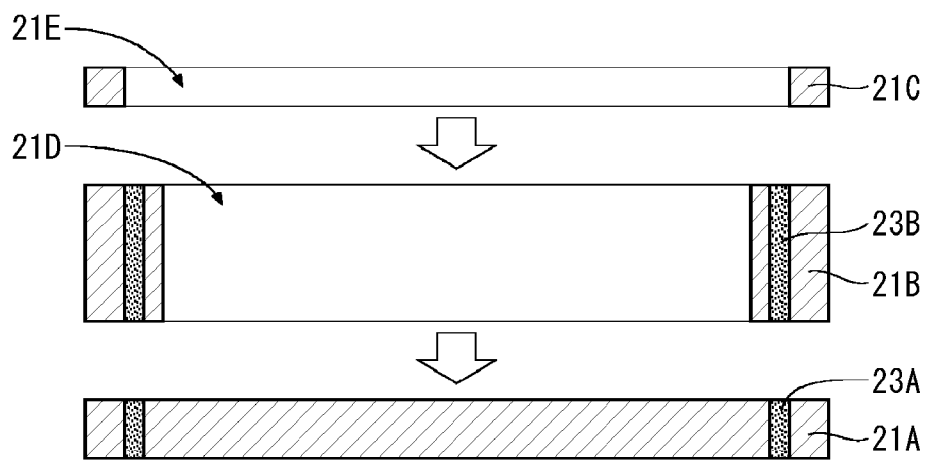
FIG. 6A to FIG. 9B are diagrams showing processes of manufacturing the semiconductor acceleration sensor device according to the first embodiment of the present invention.

In this manufacturing method, first, green sheets 21A, 21B and 21C are prepared as components for making up the lower container 21, as shown in FIG. 6A. The green sheet 21C is a component for forming the sidewalls of the cavity 21c above the step surfaces 21b in the lower container 21. The green sheet 21B is a component for forming the sidewalls of the cavity 21c below the step surfaces 21b in the lower container 21. The green sheet 21A is a component forming the bottom plate of the lower container 21. Here, each of the green sheets 21C, 21B and 21A may have a multi-layer structure including multiple green sheets.

The green sheet 21C has a cavity 21E that is opened by a puncher. The green sheet 21B has a cavity 21D and via holes for forming portions (i.e., the upper portions) of the wiring patterns 23 that are opened by a puncher. The green sheet 21A has via holes for forming portions (i.e., the lower portions) of the wiring patterns 23 that are opened by a puncher. Here, the cavity 21E formed in the green sheet 21C is slightly larger than the cavity 21D formed in the green sheet 21B. By this arrangement, the step surfaces 21b will be formed when the green sheet 21B is laminated on the green sheet 21C.

Here, the via holes of the green sheet 21B are arranged to overlap the via holes of the green sheet 21A when the green sheet 21B is placed over the green sheet 21A. These via holes are filled with conductive patterns 23B and 23A, which will eventually turn into wiring patterns 23, by a screen printing method, for instance.

Figure 6B:
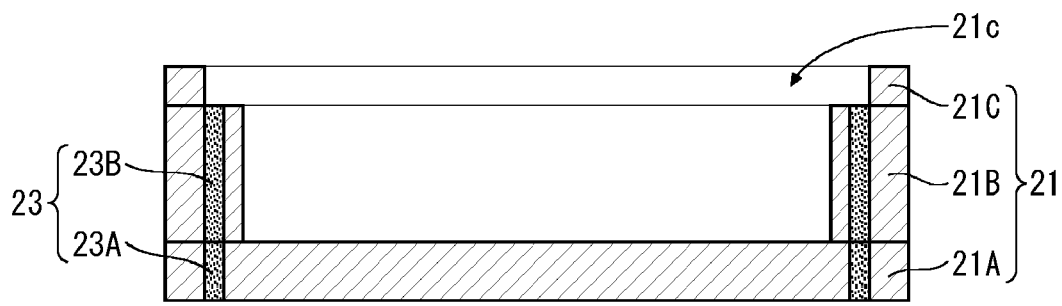

Next, as shown in FIG. 6B, the green sheets 21C, 21B and 21A are laminated sequentially, pressed together in the vertical direction and then have a calcination process conducted thereon, in order to form the lower container 21 including the cavity 21c and the wiring patterns 23. This calcination process may be conducted under normal pressure at a temperature of 1500° C. for 24 hours.

Figure 6C:
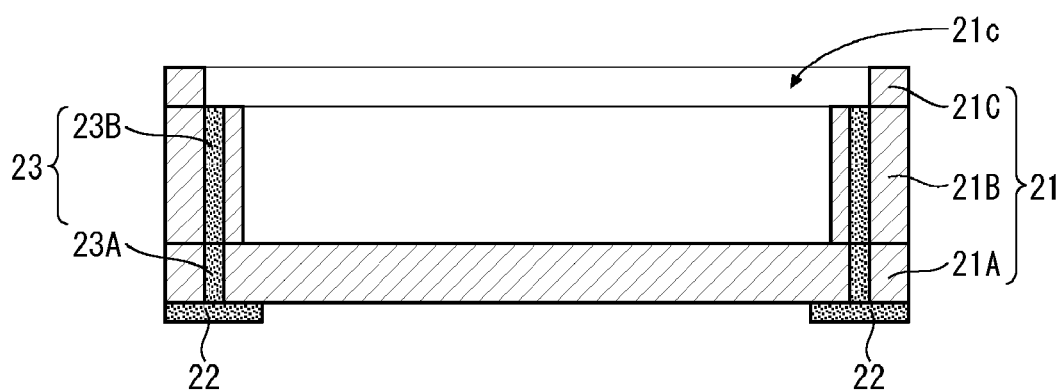

After that, as shown in FIG. 6C, the foot patterns 22 which are to be electrically connected with the wiring patterns 23 are formed on the lower face of the lower container 21 by means of a screen printing method, for instance. Here it is possible to form the foot patterns 22 prior to bonding the green sheets 21C, 21B, and 21A.

Figure 7A:
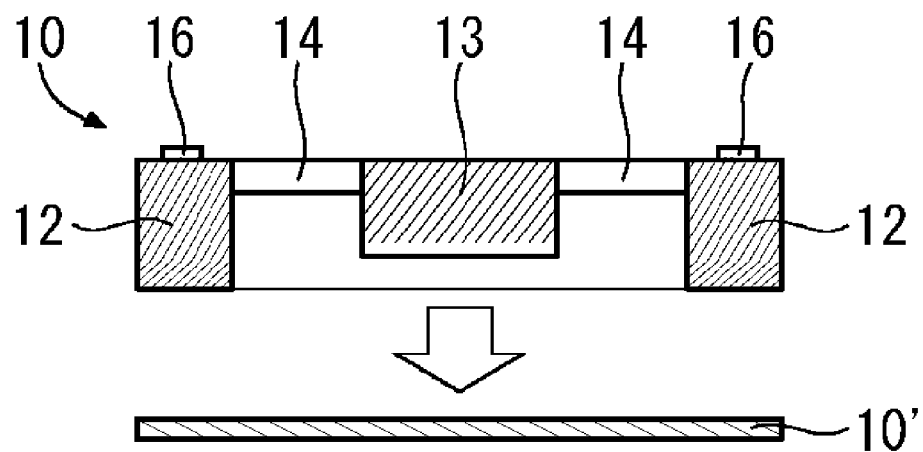

In addition, as shown in FIG. 7A, the glass substrate 10' is anodic-bonded to the semiconductor acceleration sensor chip 10 in order to prepare the semiconductor acceleration sensor chip 10 with the glass substrate 10' bonded to the back side. In the anodic bonding process, the heating temperature may be set to 300 to 400° C. and the applied voltage may be set to 500 to 1000V (volt), for instance.

Figure 8A:
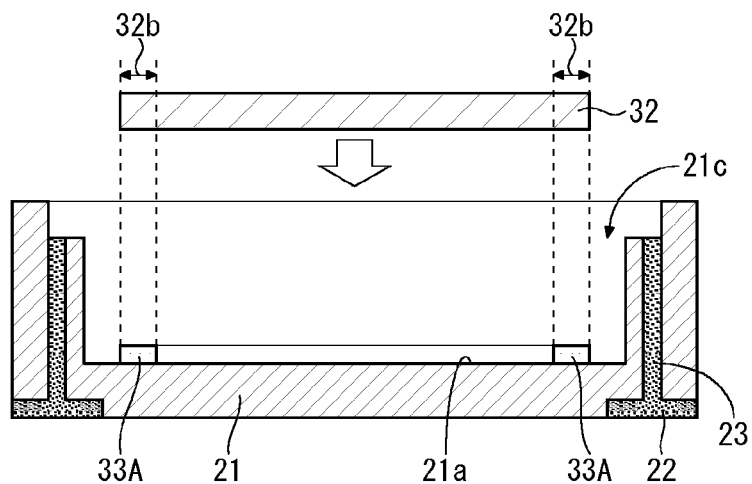

After the semiconductor acceleration sensor chip 10 having the glass substrate 10' anodic-bonded to the back side and the lower container 21 including the wiring patterns 23 and the foot patterns 22 are set in the above-described way, the spacer 32 made of silicon is prepared, and an adhesive material 33A made of silicone resin, for instance, is applied to the outer edge of the region where the spacer 32 is to be disposed on the bottom face 21 of the cavity 21c in the lower container 21 (i.e., the region corresponding to the margin 32b), as shown in FIG. 8A. Then, the spacer 32 is placed at a predetermined position on the bottom face 21 of the cavity 21c in the lower container 21 (i.e., the position where the outer edge of the spacer 32 overlaps the region where the adhesive material 33A is applied), and this structure as a whole is to be heat-treated. By this process, the adhesive material 33A will be solidified to form the adhesive portion 33, and the spacer 32, which is to function as a pedestal for the semiconductor acceleration sensor chip 10, will be fixed to the bottom face 21a of the cavity 21c. Here, the heat treatment, may be conducted at a temperature of 180° C. for one hour.

Figure 8B:
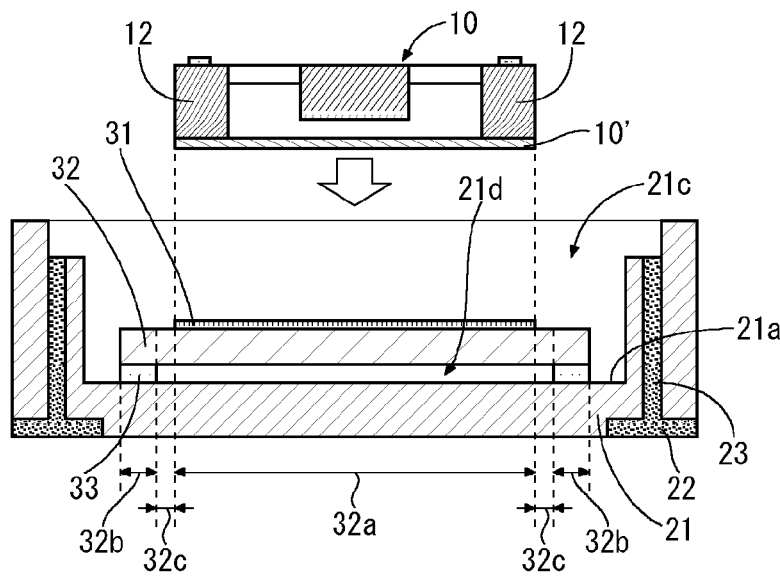
Figure 8C:
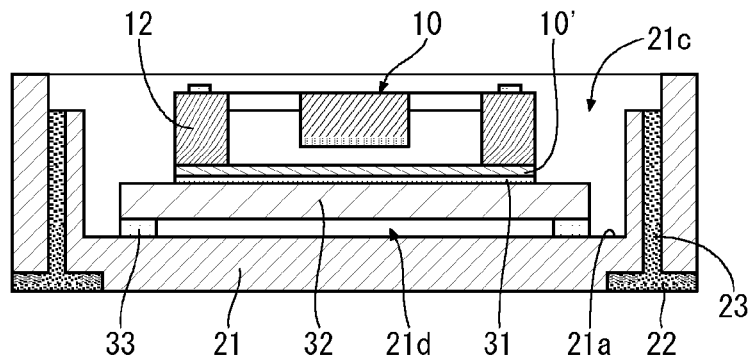

Next, as shown in FIG. 8B, the adhesive material 31 made of silver (Ag), for instance, is to be applied to a predetermined region of the upper face of the spacer 32 fixed to the bottom face 21a of the cavity 21c, which at least includes the region where the semiconductor acceleration sensor chip 10 (including the glass substrate 10') is mounted. Then, the semiconductor acceleration sensor chip 10 having the glass substrate 10' bonded to the back side will be mounted on the chip mount region 32a on the bottom face 21a of the spacer 32, and this structure as a whole will be heat-treated. By this process, the semiconductor acceleration sensor chip 10 (including the glass substrate 10') will be fixed to the spacer 32 through the adhesive material 31, as shown in FIG. 8C. Here, the heat treatment may be conducted at a temperature of 180° C. for one hour.

Figure 9A:
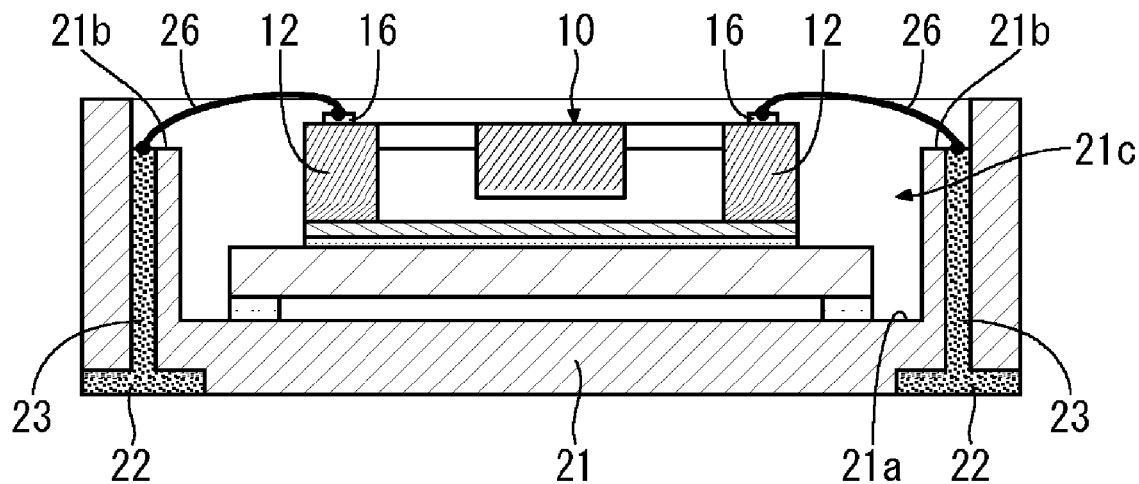

Next, as shown in FIG. 9A, by bonding metal wires 26 comprised of gold, for instance, between the electrode pads 16 in the semiconductor sensor chip 10 and the exposed portions of the wiring patterns 23 in the lower container 21, the electrode pads 16 and the wiring patterns 23 will be connected electrically. As for the bonding process, it is possible to use an ultrasonic concomitant thermal compression method under 50 gf ($/cm^2$) of pressure and 250° C. of temperature, for instance. Here, the wiring pads 16 having one ends of the metal wires 26 bonded thereto, respectively, are formed on the fixing portion 12 of the semiconductor acceleration sensor chip 10. Therefore, the beams 13, etc., in the semiconductor acceleration sensor chip 10 will not be damaged at the time of bonding the metal wires 26.

Figure 9B:
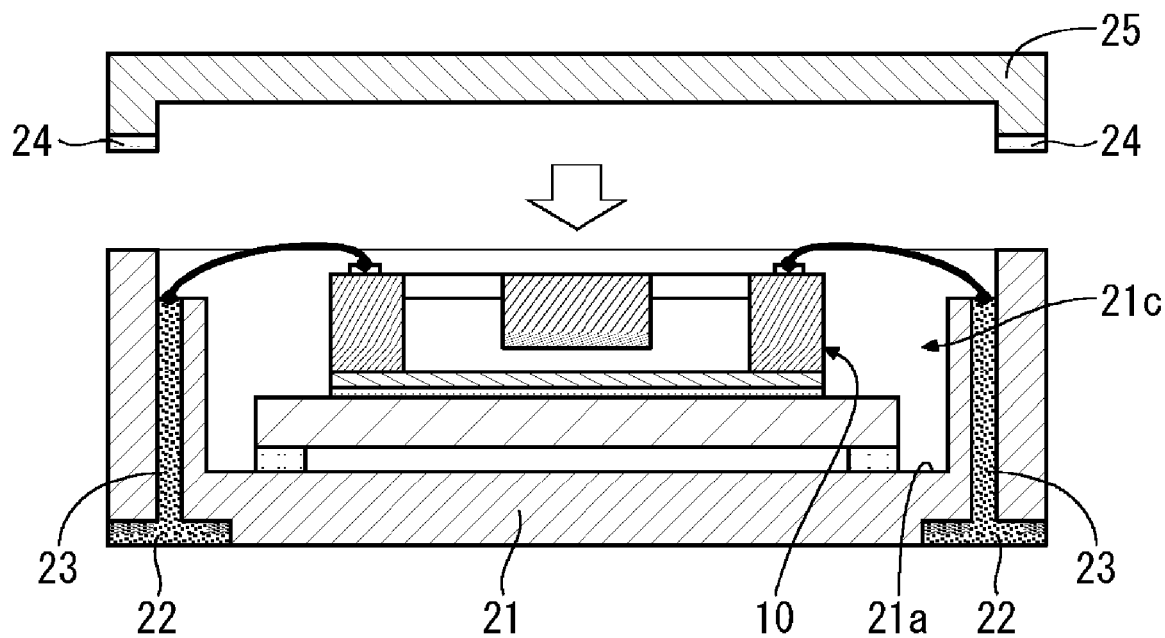

Next, as shown in FIG. 9B, the upper lid 25 made of 42 alloy metal or stainless steel, etc. is prepared, and the thermosetting resin 24 such as an epoxy resin, etc., is applied to the lower face of the upper lid 25. Then the upper lid 25 is placed over the lower container 21, and this combination will be heat-treated while being pressed together in the vertical direction. Thus, the upper lid 25 will be fixed to the lower container 21. Here, the heat treatment may be conducted under 5 kg (/cm$^2$) of pressure at a temperature of 150° C. for two hours. In this way, the semiconductor acceleration sensor device 1 as illustrated in FIG. 2 to FIG. 5 can be manufactured. Here, in sealing the lower container 21 with the upper lid 25, the cavity 21c is to be purged by nitrogen gas or dry air, etc., for instance.

As described above, the semiconductor acceleration sensor device 1, which is a semiconductor device according to the first embodiment of the present invention, has a cavity 21c in the interior thereof, and includes a package comprising a lower container 21 and an upper lid 25, a semiconductor acceleration sensor chip 10, a spacer 32 comprising a chip mount region 32a on the upper face to which the semiconductor acceleration sensor chip 10 is fixed and regions at the lower face not including the region underneath the chip mount region 32a (i.e., a margin 32b and a dividing region 32c), and an adhesive portion 33 for fixing the semiconductor acceleration sensor chip 10 to the bottom face 21a of the cavity 21c.

Thus, by fixing the spacer 32 having the semiconductor acceleration sensor chip 10 mounted thereon to the package to the region other than the region under the semiconductor acceleration sensor chip 10, it will be possible to prevent the semiconductor acceleration sensor chip 10 from being directly influenced by possible deformation generated at the spacer 32 due to heat expansion of the adhesive portion 33. As a result, it will be possible to reduce deformation that might be generated in the semiconductor acceleration sensor chip 10 fixed to the chip mount region 32a on the upper face of the spacer 32, and thus, it will be possible to realize a semiconductor acceleration sensor device 1 which is capable of operating stably with respect to temperature changes.

Likewise, by fixing the spacer 32 having the semiconductor acceleration sensor chip 10 mounted thereon to the package on the region other than the region under the semiconductor acceleration sensor chip 10, it will be possible to prevent the semiconductor acceleration sensor chip 10 from being directly influenced by a deformed part of the spacer 32, even when deformation generated in the package due to external forces or temperature changes is transmitted to the spacer 32. As a result, it will be possible to reduce deformation that might be generated in the semiconductor acceleration sensor chip 10 fixed to the chip mount region 32a on the upper face of the spacer 32, and thus, it will be possible to realize a semiconductor acceleration sensor device 1 which is capable of operating stably with respect to external forces or temperature changes.

Second Embodiment

Next, a second embodiment of the present invention will be described in detail with reference to the drawings. In the following, the same reference numbers will be used for the structural elements that are the same as the first embodiment, and redundant explanations of those structural elements will be omitted.

Structure of Semiconductor Acceleration Sensor Device 2

Figure 10:
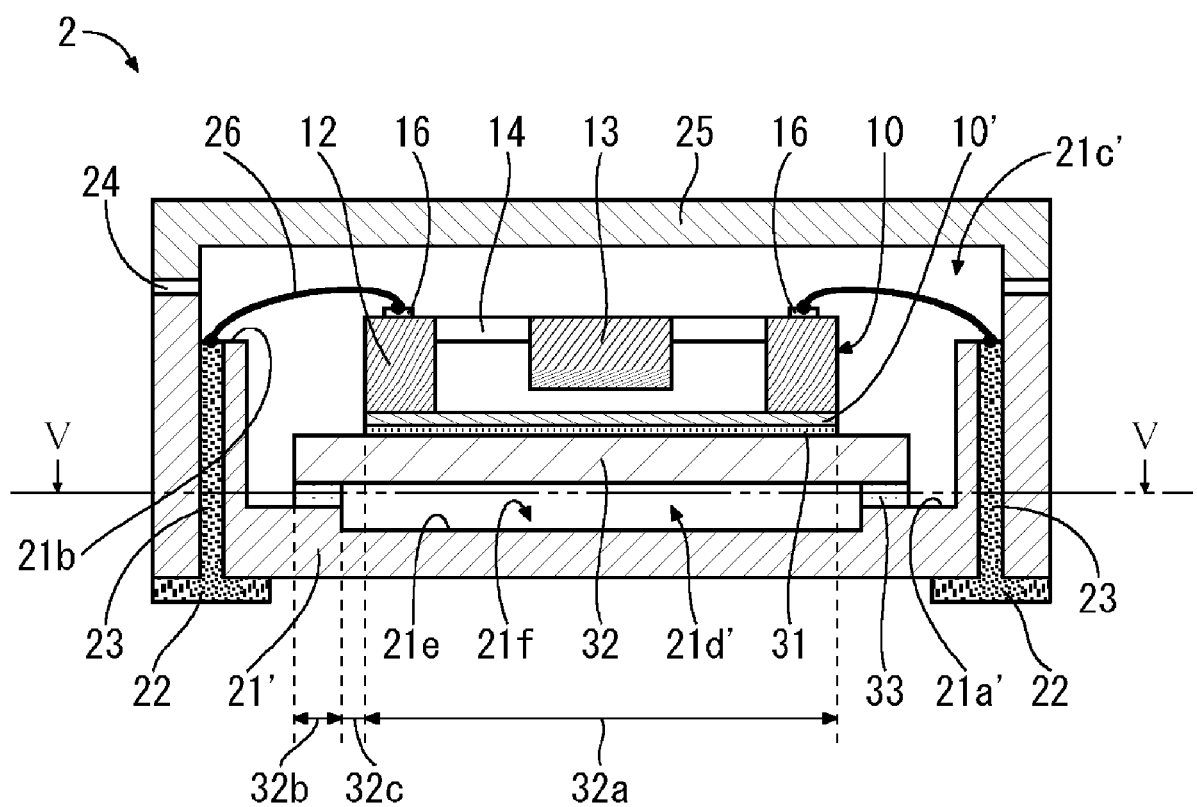
FIG. 10 is a sectional view of a semiconductor acceleration sensor device according to a second embodiment of the present invention.
Figure 11:
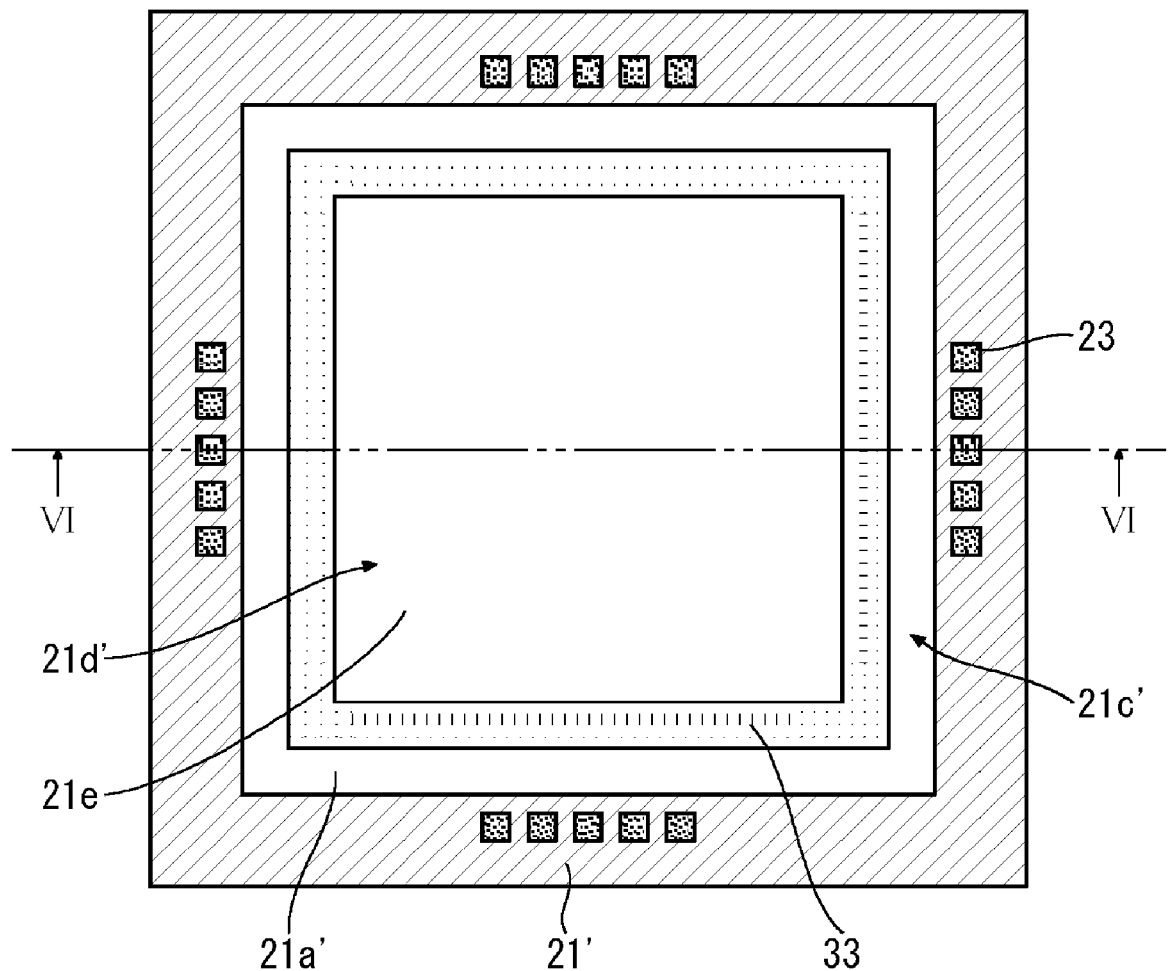
FIG. 11 is a sectional view of the semiconductor acceleration sensor device according to the second embodiment of the present invention taken along line V-V' shown in FIG. 10.

FIG. 10 is a sectional view of the semiconductor acceleration sensor device 2. FIG. 11 is a sectional view of the semiconductor acceleration sensor device 2 taken along line V-V' shown in FIG. 10. Here, the section shown in FIG. 10 corresponds to a section of the semiconductor acceleration sensor device 2 taken along line VI-VI' shown in FIG. 10.

As shown in FIG. 10 and FIG. 11, the semiconductor acceleration sensor device 2 has the same structure as the semiconductor acceleration sensor device 1 of the first embodiment. except that the lower container 21 is replaced with a lower container 21'.

The lower container 21' has a second bottom face 21e whose position is lower than a first bottom face 21a' where the spacer 32 is fixed at the bottom of the cavity 21c' through the adhesive portion 33. In other words, the lower container 21' has a concave portion 21f at the inside of the region where the adhesive portion 33 for fixing the spacer 32 to the first bottom face 21a' of the cavity 21c' is formed. For instance, the concave portion 21f may be formed by engraving the bottom face of the cavity 21c' including the first bottom face 21a'. Therefore, a hollow space 21d' which is more spacious in the vertical direction than the hollow space 21d in the first embodiment will be formed in between the spacer 32 and the lower container 21'.

According to the above mentioned structure, the border line between the first bottom face 21a' and the second bottom face 21e lies at the internal edge of the region where the adhesive portion 33 for fixing the spacer 32 to the first bottom face 21a' is formed. That is, the lateral sides of the concave portion 21f are positioned at the internal edge of the region where the adhesive portion 33 is formed.

The concave portion 21f is a structure for keeping adhesive material which has seeped from between the spacer 32 and the first bottom face 21a' when the spacer 32 is adhered to the first bottom face 21a' away from the lower face of the spacer 32. In this structure, the adhesive material seeping from between the spacer 32 and the first bottom face 21a' when the spacer 32 is adhered to the first bottom face 21a' will flow inside the concave portion 21f. By this arrangement, it is possible to prevent the region underneath the region where the semiconductor acceleration sensor chip 10 is disposed (the chip mount region 32a) from adhering to the cavity 21c' by means of the adhesive material seeping from between the spacer 32 and the first bottom face 21a'. In other words, it is possible to prevent the adhesive portion 33 from extending to the region underneath the chip mound region 32a.

Since the remaining structures of the semiconductor acceleration sensor device 2 and the semiconductor acceleration sensor chip 10 are the same as the structures of the semiconductor acceleration sensor device 1 and the semiconductor acceleration sensor chip 10 of the first embodiment, a detailed description thereof will be omitted.

Method of Manufacturing Semiconductor Acceleration Sensor Device 2

Now, a method of manufacturing the semiconductor acceleration sensor device 2 according to the second embodiment of the present invention will be described in detail with reference to the drawings.

Figure 7B:
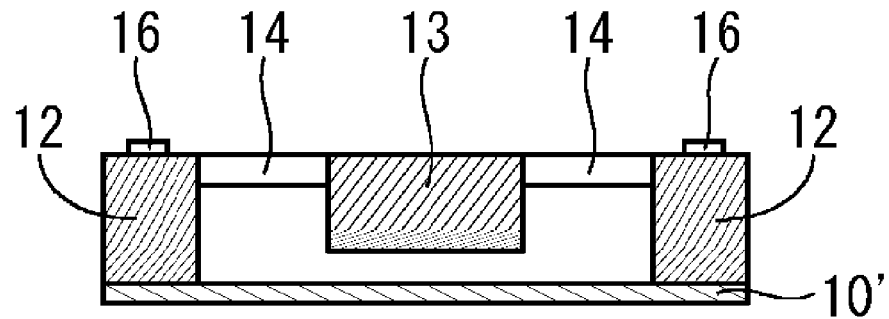

In this manufacturing method, processes for bonding the glass substrate 10' to the lower face of the semiconductor acceleration sensor chip 10 are the same as the processes in the first embodiment described with reference to FIG. 7A and FIG. 7B, and therefore, redundant explanations of those processes will be omitted.

Figure 12A:
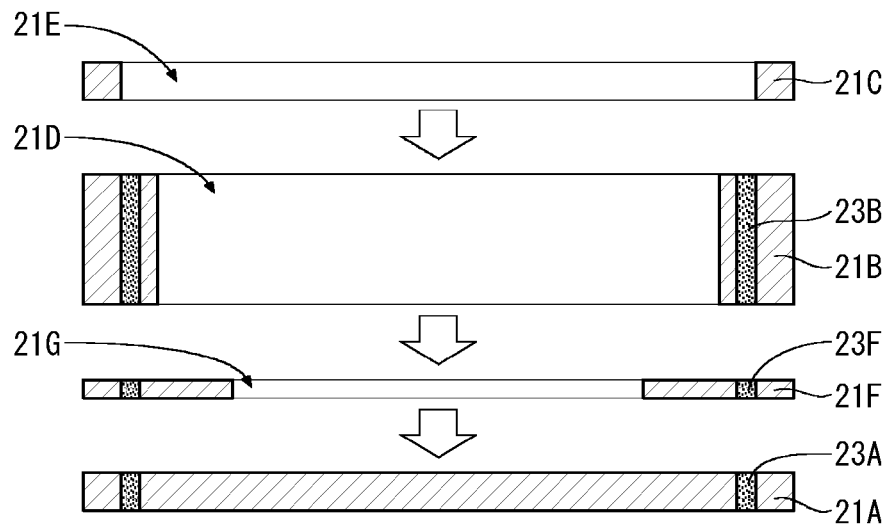
FIG. 12A to FIG. 13C are diagrams showing processes of manufacturing the semiconductor acceleration sensor device according to the second embodiment of the present invention.

In this manufacturing method, first, green sheets 21A, 21B, 21C and 21F are prepared as components which form the lower container 21', as shown in FIG. 12A. The green sheets 21A, 21B and 21C are the same as those in the first embodiment. Here, the thicknesses of the green sheets 21A, 21B and 21C may differ from those in the first embodiment.

The green sheet 21F is disposed between the green sheet 21A and the green sheet 21B. The green sheet 21F has a cavity 21G and via holes for forming portions (i.e., upper portions) of the wiring patterns 23 that are opened by a puncher. Here, the cavity 21G formed at the green sheet 21F will eventually become the concave portion 21f in the cavity 21c' after the lower container 21' is formed. The cavity 21G formed in the green sheet 21F is slightly smaller than the cavity 21D formed in the green sheet 21B.

Here, the via holes of the green sheets 21B, 21F and 21A will overlap with each other when the green sheets 21B, 21F and 21A are laminated sequentially. These via holes are filled with conductive patterns 23B, 23F and 23A, which will eventually become wiring patterns 23 by means of a screen printing method, for instance.

Figure 12B:
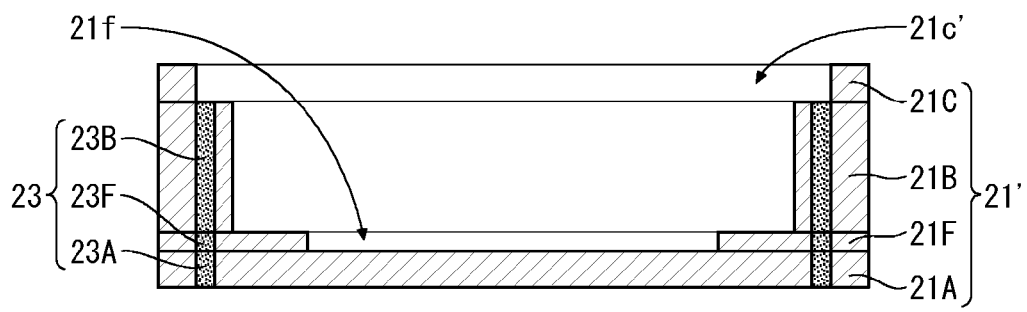

Next, as shown in FIG. 12B, the green sheets 21C, 21B, 21F and 21A are laminated sequentially, pressed together in the vertical direction and then have a calcination process conducted thereon, in order to form the lower container 21' including the cavity 21c' and the wiring patterns 23. This calcination process may be conducted under normal pressure at a temperature of 1500° C. for 24 hours.

Figure 12C:
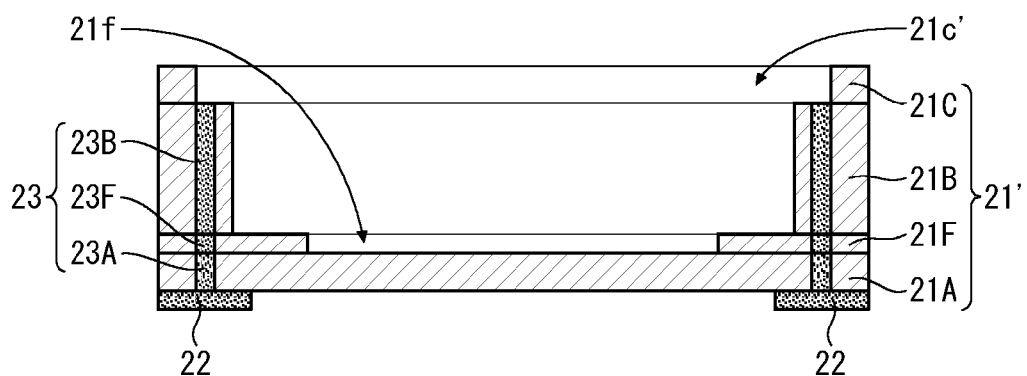

After that, as shown in FIG. 12C, the foot patterns 22 which are to be electrically connected with the wiring patterns 23 are formed on the lower face of the lower container 21', by means of a screen printing method, for instance. Here, it is possible to form the foot patterns 22 prior to bonding the green sheets 21C, 21B, 21F, and 21A.

Figure 13A:
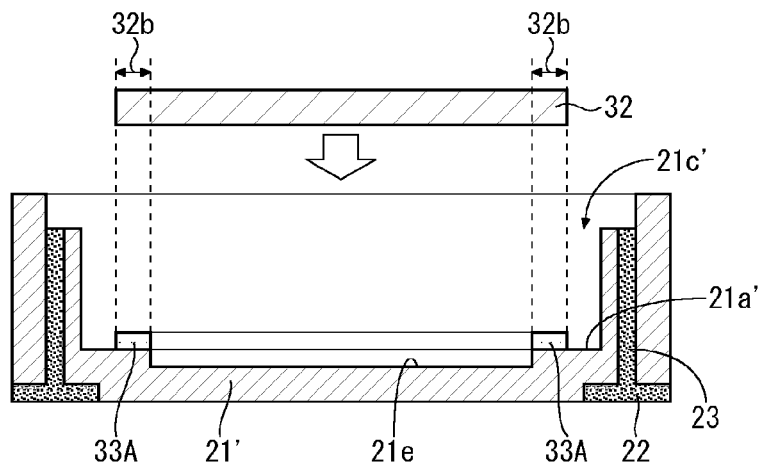

After the semiconductor acceleration sensor chip 10 having the glass substrate 10' anodic-bonded to the back side and the lower container 21' including the wiring patterns 23 and the foot patterns 22 are set in the above-described way, the spacer 32 made of silicon is prepared and an adhesive material 33A made of silicone resin, for instance, is applied to the outer edge of the region where the spacer 32 is to be disposed on the first bottom face 21a' of the cavity 21c' in the lower container 21' (i.e., the region corresponding to the margin 32b), as shown in FIG. 13A. Then, the spacer 32 is placed at a predetermined position on the first bottom face 21a' of the cavity 21c' in the lower container 21' (i.e., the position where the outer edge of the spacer 32 overlaps the region where the adhesive material 33A is applied), and this structure as a whole is to be heat-treated. By this process, the adhesive material 33A will be solidified to form the adhesive portion 33, and the spacer 32, which is to function as a pedestal for the semiconductor acceleration sensor chip 10, will be fixed to the first bottom face 21a' of the cavity 21c'. Here, the heat treatment, may be conducted at a temperature of 180° C. for one hour.

Figure 13B:
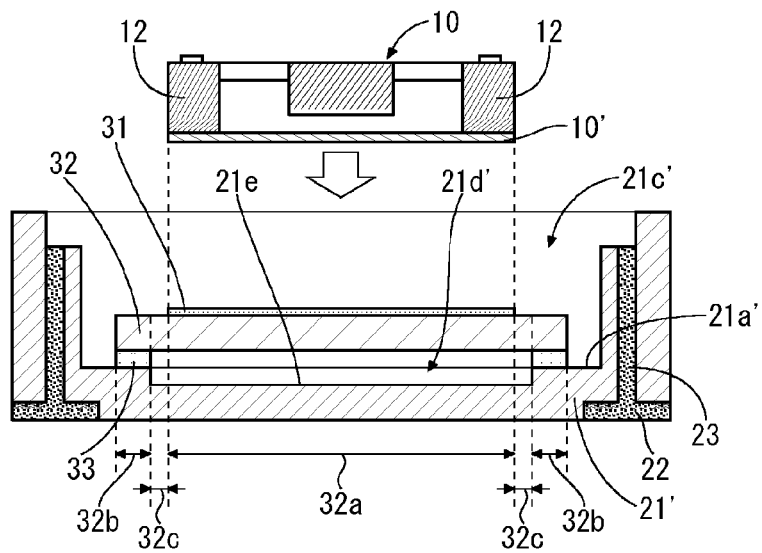
Figure 13C:
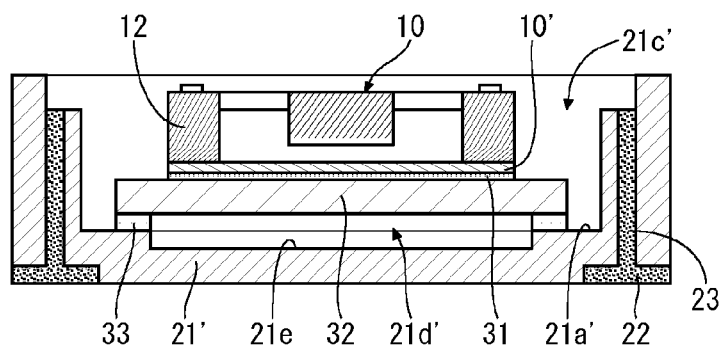

Next, as shown in FIG. 13B, an adhesive material 31 made of silver (Ag), for instance, is to be applied to a predetermined region of the upper face of the spacer 32 fixed to the first bottom face 21a' of the cavity 21c' which at least includes the region where the semiconductor acceleration sensor chip 10 (including the glass substrate 10') is mounted. Then, the semiconductor acceleration sensor chip 10 having the glass substrate 10' bonded to the back side will be mounted on the chip mount region 32a on the first bottom face 21a' of the spacer 32, and this entire structure as a whole will be heat-treated. By this process, the semiconductor acceleration sensor chip 10 (including the glass substrate 10') will be fixed to the spacer 32 through the adhesive material 31, as shown in FIG. 13C. Here, the heat treatment, may be conducted at a temperature of 180° C. for one hour.

After that, as with the first embodiment, by bonding the metal wires 26 between the electrode pads 16 in the semiconductor acceleration sensor chip 10 and the exposed portions of the wiring patterns 23 in the lower container 21', and adhering the upper lid 25 to the lower container 21' by means of the thermosetting resin 24, the semiconductor acceleration sensor device 2 as illustrated in FIG. 10 and FIG. 11 can be manufactured. Here, in sealing the lower container 21' with the upper lid 25, the cavity 21c' is to be purged by nitrogen gas or dry air, etc., for instance.

As described above, the semiconductor acceleration sensor device 2, which is a semiconductor device according to the second embodiment of the present invention, has a cavity 21c' in the interior thereof, and includes a package comprised of a lower container 21' and an upper lid 25, a semiconductor acceleration sensor chip 10, a spacer 32 including a chip mount region 32a on the upper face to which the semiconductor acceleration sensor chip 10 is fixed and regions at the lower face not including the region underneath the chip mount region 32a (i.e., a margin 32b and a dividing region 32c), and an adhesive portion 33 for fixing the semiconductor acceleration sensor chip 10 to a first bottom face 21a' of the cavity 21c'.

In this way, as with the first embodiment, by fixing the spacer 32 having the semiconductor acceleration sensor chip 10 mounted thereon to the package at the region thereon other than under the semiconductor acceleration sensor chip 10, it will be possible to prevent the semiconductor acceleration sensor chip 10 from being directly influenced by possible deformation generated at the spacer 32 due to heat expansion of the adhesive portion 33. As a result, it will be possible to reduce deformation that might be generated in the semiconductor acceleration sensor chip 10 fixed to the chip mount region 32a on the upper face of the spacer 32, and thus, it will be possible to realize a semiconductor acceleration sensor device 2 which is capable of operating stably with respect to temperature changes.

Likewise, as with the first embodiment, by fixing the spacer 32 having the semiconductor acceleration sensor chip 10 mounted thereon to the package at the region thereon other than under the semiconductor acceleration sensor chip 10, it will be possible to prevent the semiconductor acceleration sensor chip 10 from being directly influenced by a deformed part of the spacer 32, even when deformation generated at the package due to external force or temperature change is transmitted to the spacer 32. As a result, it will be possible to reduce deformation that might be generated in the semiconductor acceleration sensor chip 10 fixed to the chip mount region 32a on the upper face of the spacer 32, and thus, it will be possible to realize a semiconductor acceleration sensor device 2 which is capable of operating stably with respect to external forces or temperature changes.

Furthermore, the semiconductor acceleration sensor device 2 according to the second embodiment of the present invention has a concave portion 21f at the bottom of the cavity 21c' in the lower container 21' where the spacer 32 is fixed and at least under the semiconductor acceleration chip 10.

In this way, by having such concave portion 21f at least under the semiconductor acceleration sensor chip 10, it will be possible to prevent a region underneath the location where the semiconductor acceleration sensor chip 10 is disposed on the spacer 32 (i.e., underneath the chip mount region 32a) from being accidentally adhered to the bottom of the cavity 21c' due to the adhesive material spreading at the time of adhering the spacer 32. In other words, it will be possible to prevent the adhesive portion 33 from being formed unnecessarily underneath the chip mount region 32a.

Third Embodiment

Next, a third embodiment of the present invention will be described in detail with reference to the drawings. In the followings, the same reference numbers will be used for the structural elements that are the same as the first or second embodiment, and redundant explanations of those structural elements will be omitted.

Structure of Semiconductor Acceleration Sensor Device 3

Figure 14:
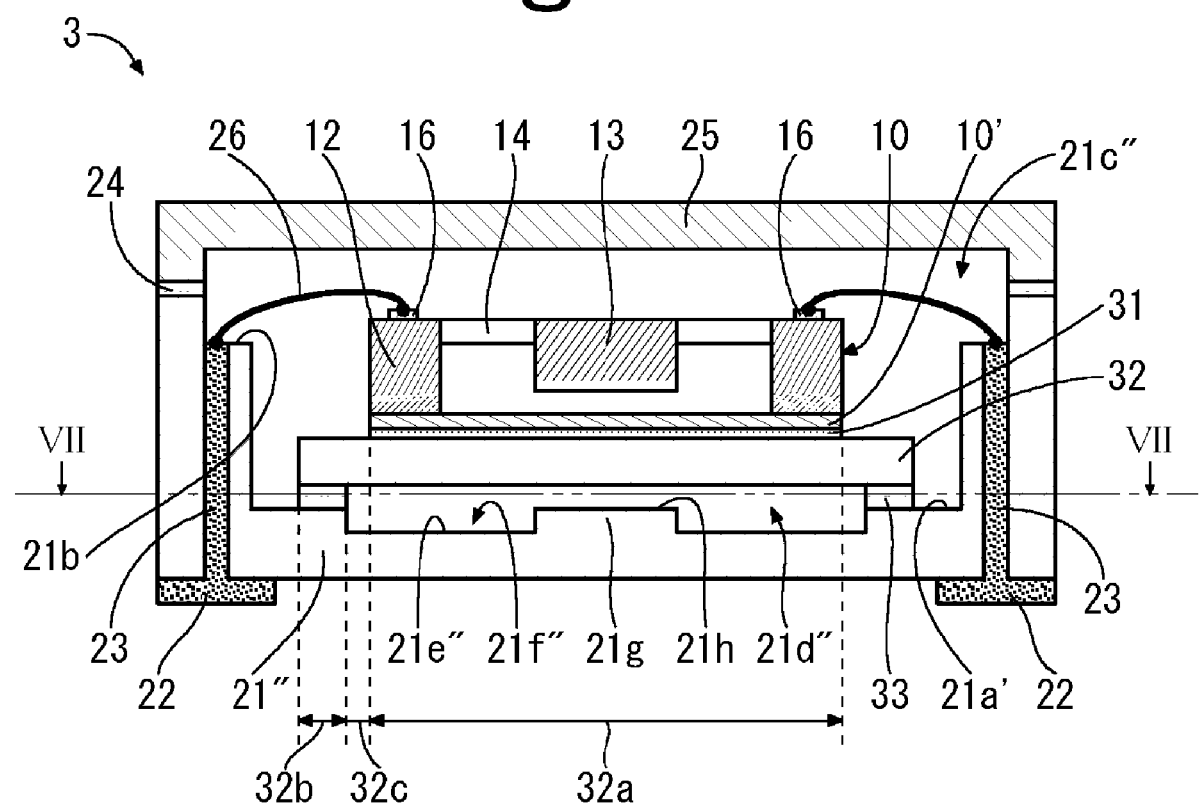
FIG. 14 is a sectional view of a semiconductor acceleration sensor device according to a third embodiment of the present invention.
Figure 15:
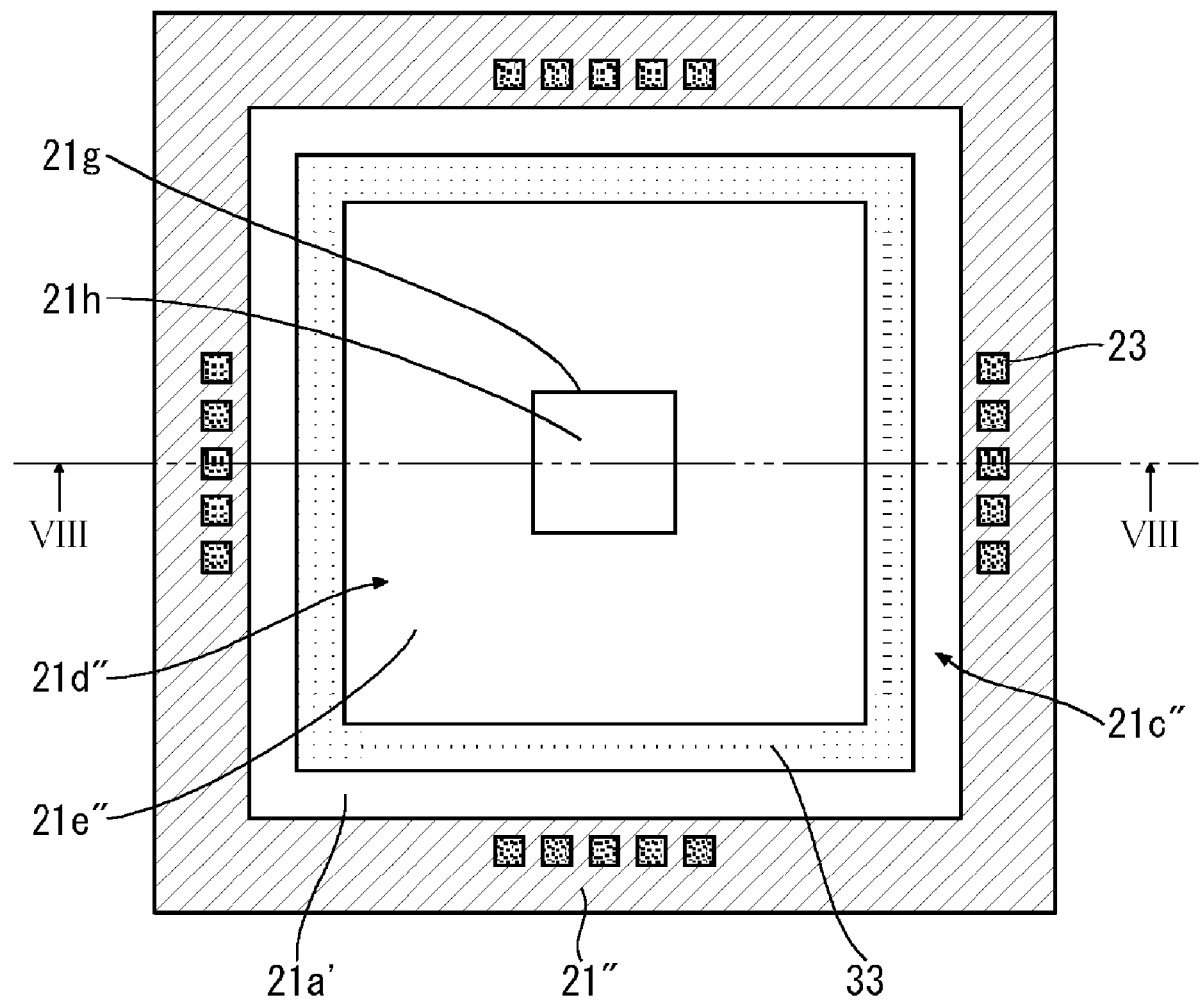
FIG. 15 is a sectional view of the semiconductor acceleration sensor device according to the third embodiment of the present invention taken along line VII-VII' shown in FIG. 14.

FIG. 14 is a sectional view of the semiconductor acceleration sensor device 3. FIG. 15 is a sectional view of the semiconductor acceleration sensor device 3 taken along line VII-VII' shown in FIG. 14. Here, the section shown in FIG. 14 corresponds to a section of the semiconductor acceleration sensor device 3 taken along line VIII-VIII' shown in FIG. 14.

As shown in FIG. 14 and FIG. 15, the semiconductor acceleration sensor device 3 has the same structure as the semiconductor acceleration sensor device 1 of the first embodiment, except that the lower container 21 is replaced with a lower container 21".

As with the second embodiment, the lower container 21" has a second bottom face 21e" whose position is lower than a first bottom face 21a' where the spacer 32 is fixed at the bottom of the cavity 21c" through the adhesive portion 33. In other words, the lower container 21" has a concave portion 21f" at the inside of the region where the adhesive portion 33 for fixing the spacer 32 to the first bottom face 21a" of the cavity 21c" is formed. For instance, the concave portion 21f" may be formed by engraving the bottom face of the cavity 21c" including the first bottom face 21a". Accordingly, the border line between the first bottom face 21a' and the second bottom face 21e" lies at the internal edge of the region where the adhesive portion 33 for fixing the spacer 32 to the first bottom face 21a' is formed. That is, the lateral sides of the concave portion 21f" are positioned at the internal edge of the region where the adhesive portion 33 is formed.

The concave portion 21f" is a structure for preventing adhesive material that has seeped from between the spacer 32 and the first bottom face 21a' when the spacer 32 is adhered to the first bottom face 21a' away from the lower face of the spacer 32. In this structure, adhesive material seeping from between the spacer 32 and the first bottom face 21a' when the spacer 32 is adhered to the first bottom face 21a' will flow inside the concave portion 21f". By this arrangement, it is possible to prevent the region underneath the region where the semiconductor acceleration sensor chip 10 is disposed (the chip mount region 32a) from adhering to the cavity 21c" by means of the adhesive material seeping from between the spacer 32 and the first bottom face 21a". In other words, it is possible to prevent the adhesive portion 33 from extending to the region underneath the chip mound region 32a.

Furthermore, a convex portion 21g having an upper face 21h which is higher than the second bottom face 21e" is formed at the approximate center of the second bottom face 21e" of the concave portion 21f". The convex portion 21g functions as a supporting portion in order to prevent the spacer 32 from distorting to a considerable extent due to pressure applied vertically when the spacer 32 is fixed to the first bottom face 21a'. The upper face 21h of the convex portion 21g is approximately the same height as the first bottom face 21a' on which the spacer 32 is fixed by means of the adhesive material, for instance. Therefore, a hollow space 21d" having a space at the center of which that is approximately the same in the vertical direction as in the first embodiment, and the remaining space thereof is more spacious in the vertical direction than the hollow space 21d in the first embodiment, will be formed in between the spacer 32 and the lower container 21". However, this type of structure is not a limiting condition in this embodiment, and may be any structure in which the convex portion 21g has a height not touching the bottom face of the spacer 32 fixed to the first bottom face 21a' while pressure is not being applied for purposes of adhesion, and the height of the convex portion 21g is suitable to support the spacer 32 to the extent that no damage such as cracks will be generated in the spacer 32 and in the semiconductor acceleration sensor chip 10 when pressure is applied added.

Since the remaining structures of the semiconductor acceleration sensor device 3 and the semiconductor acceleration sensor chip 10 are the same as the structures of the semiconductor acceleration sensor device 1 and the semiconductor acceleration sensor chip 10 of the first embodiment, a detailed description thereof will be omitted.

Method of Manufacturing Semiconductor Acceleration Sensor Device 3

Now, a method of manufacturing the semiconductor acceleration sensor device 3 according to the third embodiment of the present invention will be described in detail with reference to the drawings.

In this manufacturing method, the processes for bonding the glass substrate 10' to the lower face of the semiconductor acceleration sensor chip 10 are the same as the processes in the first embodiment described with reference to FIG. 7A and FIG. 7B, and therefore, redundant explanations of those processes will be omitted.

Figure 16A:
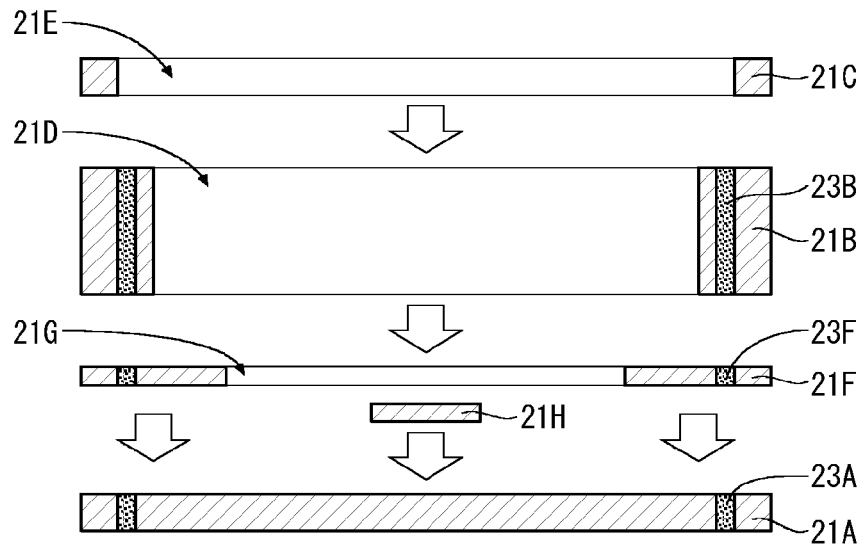
FIG. 16A to FIG. 17C are diagrams showing processes of manufacturing the semiconductor acceleration sensor device according to the third embodiment of the present invention.

In this manufacturing method, first, green sheets 21A, 21B, 21C, 21F and 21H are prepared as components which form the lower container 21", as shown in FIG. 16A. Here, the green sheets 21A, 21B, 21C and 21F are the same as those in the second embodiment, but the thicknesses of the green sheets 21A, 21B, 21C and 21F may differ from those in the second embodiment.

The green sheet 21H is a member for forming the convex portion 21g in the concave portion 21f". The green sheet 21H is disposed at the approximate center of the cavity 21G. The thickness of the green sheet 21H is approximately the same as the green sheet 21F, for instance.

Figure 16B:
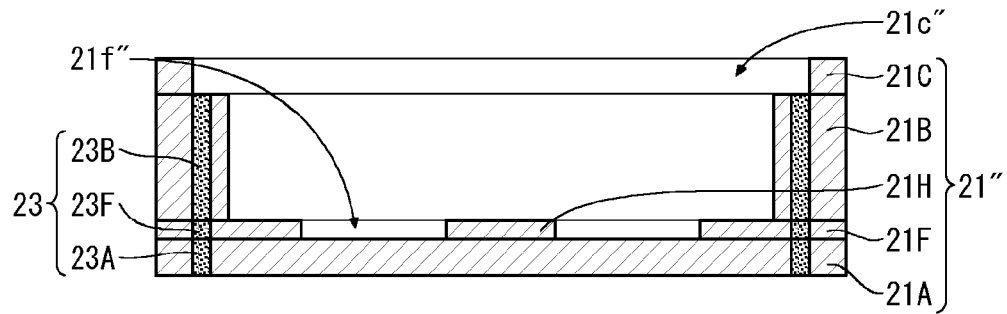

Next, as shown in FIG. 16B, the green sheets 21C, 21B, 21F, 21H and 21A are laminated sequentially, pressed together in the vertical direction, and then have a calcination process conducted thereon, in order to form the lower container 21" including the cavity 21c" and the wiring patterns 23. This calcination process may be conducted under normal pressure at a temperature of 1500° C. for 24 hours.

Figure 16C:
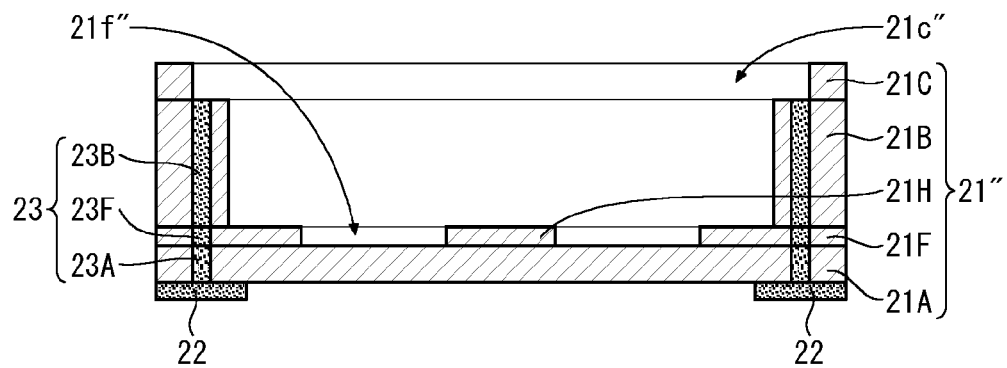

After that, as shown in FIG. 16C, the foot patterns 22 which are to be electrically connected to the wiring patterns 23 are formed on the lower face of the lower container 21", by means of a screen printing method, for instance. Here it is possible to form the foot patterns 22 prior to bonding the green sheets 21C, 21B, 21F, 21H and 21A.

Figure 17A:
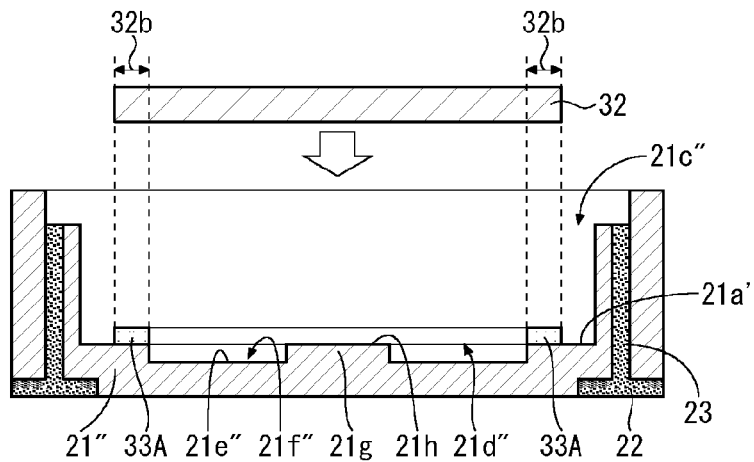

After the semiconductor acceleration sensor chip 10 having the glass substrate 10' anodic-bonded to the back side and the lower container 21" including the wiring patterns 23 and the foot patterns 22 are set in the above-described way, the spacer 32 made of silicon is prepared and an adhesive material 33A made of silicone resin, for instance, is applied to the outer edge of the region where the spacer 32 is to be disposed on the first bottom face 21a' of the cavity 21c" in the lower container 21" (i.e., the region corresponding to the margin 32b), as shown in FIG. 17A. Then, the spacer 32 is placed at a predetermined position on the first bottom face 21a' of the cavity 21c" in the lower container 21" (i.e., the position where the outer edge of the spacer 32 overlaps the region where the adhesive material 33A is applied), and this entire structure will be heat-treated. By this process, the adhesive material 33A will be solidified to form the adhesive portion 33, and the spacer 32, which is to function as a pedestal for the semiconductor acceleration sensor chip 10, will be fixed to the first bottom face 21a' of the cavity 21c". Here, the heat treatment may be conducted at a temperature of 180° C. for one hour.

Figure 17B:
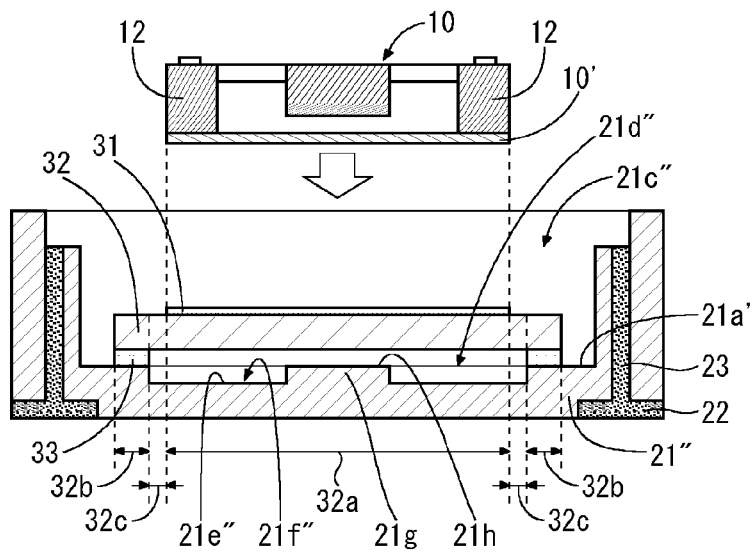
Figure 17C:
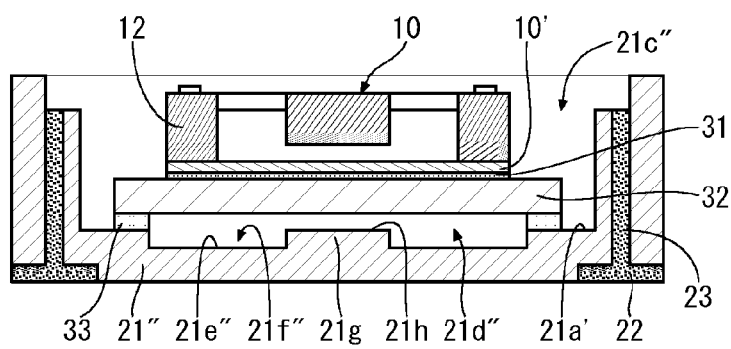

Next, as shown in FIG. 17B, a adhesive material 31 made of silver (Ag), for instance, is to be applied to a predetermined region of the upper face of the spacer 32 fixed to the first bottom face 21a' of the cavity 21c", and at least includes the region where the semiconductor acceleration sensor chip 10 (including the glass substrate 10') is mounted. Then, the semiconductor acceleration sensor chip 10 having the glass substrate 10' bonded to the back side will be mounted on the chip mount region 32a on the first bottom face 21a' of the spacer 32, and this entire structure will be heat-treated. By this process, the semiconductor acceleration sensor chip 10 (including the glass substrate 10') will be fixed to the spacer 32 through the adhesive material 31, as shown in FIG. 17C. Here, the heat treatment, may be conducted at a temperature of 180° C. for one hour.

After that, as with the first embodiment, by bonding the metal wires 26 between the electrode pads 16 in the semiconductor acceleration sensor chip 10 and the exposed portions of the wiring patterns 23 in the lower container 21", and adhering the upper lid 25 to the lower container 21" by means of the thermosetting resin 24, the semiconductor acceleration sensor device 3 as illustrated in FIG. 14 and FIG. 15 can be manufactured. Here, in sealing the lower container 21" with the upper lid 25, the cavity 21c" is to be purged by nitrogen gas or dry air, etc., for instance.

As described above, the semiconductor acceleration sensor device 3, which is a semiconductor device according to the third embodiment of the present invention, has a cavity 21c" in the interior thereof, and includes a package comprised of a lower container 21" and an upper lid 25, a semiconductor acceleration sensor chip 10, a spacer 32 including a chip mount region 32a on the upper face to which the semiconductor acceleration sensor chip 10 is fixed and regions at the lower face not including the region underneath the chip mount region 32a (i.e., a margin 32b and a dividing region 32c), and an adhesive portion 33 for fixing the semiconductor acceleration sensor chip 10 to a first bottom face 21a" of the cavity 21c".

In this way, as with the first embodiment, by fixing the spacer 32 having the semiconductor acceleration sensor chip 10 mounted thereon to the package on the region thereof other than under the semiconductor acceleration sensor chip 10, it will be possible to prevent the semiconductor acceleration sensor chip 10 from being directly influenced by possible deformation generated at the spacer 32 due to heat expansion of the adhesive portion 33. As a result, it will be possible to reduce deformation that might be generated in the semiconductor acceleration sensor chip 10 fixed to the chip mount region 32a on the upper face of the spacer 32, and thus, it will be possible to realize a semiconductor acceleration sensor device 3 which is capable of operating stably with respect to temperature changes.

Likewise, as with the first embodiment, by fixing the spacer 32 having the semiconductor acceleration sensor chip 10 mounted thereon to the package on the region thereof other than under the semiconductor acceleration sensor chip 10, it will be possible to prevent the semiconductor acceleration sensor chip 10 from being directly influenced by the deformed part of the spacer 32, even when deformation generated at the package due to external force or temperature change is transmitted to the spacer 32. As a result, it will be possible to reduce deformation that might be generated in the semiconductor acceleration sensor chip 10 fixed to the chip mount region 32a on the upper face of the spacer 32, and thus, it will be possible to achieve a semiconductor acceleration sensor device 3 which is capable of operating stably with respect to external forces or temperature changes.

Furthermore, as with the second embodiment, the semiconductor acceleration sensor device 3 according to the third embodiment of the present invention has a concave portion 21f" at the bottom of the cavity 21c" in the lower container 21" where the spacer 32 is fixed and at least under the semiconductor acceleration chip 10.

In this way, as with the second embodiment, by having such concave portion 21f" at least under the semiconductor acceleration sensor chip 10, it will be possible to prevent the region underneath where the semiconductor acceleration sensor chip 10 is disposed on the spacer 32 (i.e., underneath the chip mount region 32a) from being accidentally adhered to the bottom of the cavity 21c" due to the adhesive material spreading at the time of adhering the spacer 32. In other words, it will be possible to prevent the adhesive portion 33 from being formed unnecessarily underneath the chip mount region 32a.

In addition, the semiconductor acceleration sensor device 3 according to this embodiment has a convex portion 21g at the bottom face of the concave portion 21f" in the lower container 21" which forms the package, the convex portion 21g having a surface at a higher position than the bottom face of the concave portion 21f".

By arranging such convex portion in the concave portion 21f", the spacer 32 can be supported from below when the spacer 32 is placed on the first bottom face 21a', and therefore, it will be possible to prevent the spacer 32 from distorting to a considerable extent due to pressure applied in the vertical direction.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-217817. The entire disclosures of Japanese Patent Application No. 2005-217817 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device comprising:
   a package having a cavity therein, the package having a bottom surface;
   a rectangular board having a plurality of sides, wherein the rectangular board is a deformation relief member and has no integrated circuits therein, and wherein the rectangular board has an upper surface;
   a chip, having a semiconductor element, which is mounted on the rectangular board, the chip having a bottom surface that is smaller in size than the upper surface of the rectangular board; and;
   an adhesive portion which attaches the rectangular board to the bottom surface of the package so that the rectangular board is disposed in the cavity and spaced apart from the bottom surface of the package, the adhesive portion extending along the sides of the rectangular board but leaving a hollow space in a central region between the sides.

2. The semiconductor device according to claim 1, wherein the package has an inner side with a convex portion disposed below the chip.

3. The semiconductor device according to claim 1, wherein the adhesive portion is comprised of a solidified resin.

4. The semiconductor device according to claim 1, wherein the adhesive portion is comprised of a silicone resin or fluorine resin.

5. The semiconductor device according to claim 1, wherein the board is comprised of a silicon material.

6. The semiconductor device according to claim 1, further comprising:
   a first electrode pad on the chip;
   a wiring pattern in the package, at least a portion of the wiring pattern being exposed inside the cavity;
   a second electrode pad on the bottom face of the package and connected to the wiring pattern; and
   a metal wire electrically connecting the first electrode pad and the exposed wiring pattern.

7. The semiconductor device according to claim 1, wherein at least a portion of the package is comprised of a ceramic material.

8. The semiconductor device according to claim 1, wherein the semiconductor element comprises an acceleration sensor.

9. The semiconductor device according to claim 1, wherein the semiconductor element comprises an acceleration sensor having a fixing portion, a weight portion, and one or more beams, the fixing portion being fixed to the rectangular board, the beams suspending the weight portion from the fixing portion, and the weight portion being movable with respect to the fixing portion.

10. The semiconductor element according to claim 1, wherein the adhesive portion encircles a region of the rectangular board at which the chip is mounted.

* * * * *